United States Patent
Bielby et al.

(10) Patent No.: US 12,210,401 B2
(45) Date of Patent: Jan. 28, 2025

(54) TEMPERATURE BASED OPTIMIZATION OF DATA STORAGE OPERATIONS

(71) Applicant: Micron Technology, Inc., Boise, ID (US)

(72) Inventors: Robert Richard Noel Bielby, Placerville, CA (US); Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 527 days.

(21) Appl. No.: 16/562,197

(22) Filed: Sep. 5, 2019

(65) Prior Publication Data

US 2021/0073066 A1   Mar. 11, 2021

(51) Int. Cl.
*G06F 11/07* (2006.01)
*G01D 21/02* (2006.01)
(Continued)

(52) U.S. Cl.
CPC ........ *G06F 11/0727* (2013.01); *G06F 3/0616* (2013.01); *G06F 3/0653* (2013.01);
(Continued)

(58) Field of Classification Search
CPC ............. G06F 11/0727; G06F 11/0358; G06F 3/0616; G06F 3/0653; G06F 3/0673;
(Continued)

(56) References Cited

U.S. PATENT DOCUMENTS 5,268,835 A   12/1993   Miyagaki et al.
5,729,619 A   3/1998    Puma
(Continued)

FOREIGN PATENT DOCUMENTS

BE   1008816   8/1996
CN   1506242   6/2004
(Continued)

OTHER PUBLICATIONS

Chang, Li-Pin. "On efficient wear leveling for large-scale flash-memory storage systems." Proceedings of the 2007 ACM symposium on Applied computing, 2007.
(Continued)

*Primary Examiner* — Chun Kuan Lee
(74) *Attorney, Agent, or Firm* — Greenberg Traurig

(57) ABSTRACT

Systems, methods and apparatus of intelligent optimization of data storage operations based on operating temperature. For example, a data storage device includes: one or more storage media components; a controller; at least one temperature sensor configured to generate temperature measurements; and an artificial neural network configured to predict an operating parameter of an operation of the one or more storage media components at a temperature determined by the temperature sensor. The storage media component can use the operating parameter predicted by the artificial neural network in performing the operation, such as writing data into a memory unit or reading data from the memory unit.

(Continued)

For example, the operating parameter can be a voltage for programming multiple bits into a memory cell, or reading data from a memory cell.

20 Claims, 16 Drawing Sheets

(51) Int. Cl.
*G06F 3/06* (2006.01)
*G06F 11/30* (2006.01)
*G06N 3/04* (2023.01)
*G06N 3/049* (2023.01)
*G06N 3/08* (2023.01)
*G11C 7/04* (2006.01)
*G11C 11/54* (2006.01)
*G11C 16/10* (2006.01)
*G11C 16/32* (2006.01)

(52) U.S. Cl.
CPC ........ *G06F 3/0673* (2013.01); *G06F 11/3058* (2013.01); *G06N 3/049* (2013.01)

(58) Field of Classification Search
CPC ............. G06F 11/0739; G06F 11/3058; G06F 11/3013; G06F 11/3065; G06F 11/0751; G06N 3/049; G06N 3/08; G11C 7/04; G11C 11/54; G11C 16/10; G11C 16/32
USPC .......................................................... 710/15
See application file for complete search history.

(56) References Cited

U.S. PATENT DOCUMENTS

| | | | |
|---|---|---|---|
| 5,745,031 A | 4/1998 | Yamamoto | |
| 5,781,700 A | 7/1998 | Puskorius et al. | |
| 5,932,801 A | 8/1999 | Akishita et al. | |
| 6,097,295 A | 8/2000 | Griesinger et al. | |
| 6,130,617 A | 10/2000 | Yeo | |
| 6,131,063 A | 10/2000 | Seki et al. | |
| 6,208,981 B1 | 3/2001 | Graf et al. | |
| 6,243,015 B1 | 6/2001 | Yeo | |
| 6,594,579 B1 | 7/2003 | Lowrey et al. | |
| 6,650,979 B1 | 11/2003 | Kreft | |
| 6,661,345 B1 | 12/2003 | Bevan et al. | |
| 6,832,510 B2 | 12/2004 | Kusase | |
| 7,389,682 B2 | 6/2008 | Javaherian | |
| 7,392,129 B2 | 6/2008 | Hill et al. | |
| 8,036,788 B2 | 10/2011 | Breed | |
| 8,924,124 B2 | 12/2014 | Lockwood et al. | |
| 8,953,436 B2 | 2/2015 | Diab et al. | |
| 8,965,819 B2 | 2/2015 | Tirunagari | |
| 9,015,093 B1 | 4/2015 | Commons | |
| 9,288,270 B1 | 3/2016 | Penilla et al. | |
| 9,594,894 B2 | 3/2017 | Azar et al. | |
| 9,779,562 B1 | 10/2017 | Cook et al. | |
| 9,802,571 B2 | 10/2017 | Shreve et al. | |
| 9,963,012 B2 | 5/2018 | Stevanovic et al. | |
| 10,013,773 B1 | 7/2018 | Ogale et al. | |
| 10,036,341 B2 | 7/2018 | Kovac et al. | |
| 10,140,089 B1 | 11/2018 | Paranjpe et al. | |
| 10,176,435 B1 | 1/2019 | Sarkar et al. | |
| 10,242,665 B1 | 3/2019 | Abeloe | |
| 10,275,670 B1 | 4/2019 | Li et al. | |
| 10,457,294 B1 | 10/2019 | Zhang et al. | |
| 10,484,401 B2 | 11/2019 | Jung et al. | |
| 10,507,793 B1 | 12/2019 | De Moura | |
| 10,636,173 B1 | 4/2020 | Beach et al. | |
| 10,657,617 B1 | 5/2020 | Wang et al. | |
| 10,665,251 B1 | 5/2020 | Wood, III et al. | |
| 10,679,226 B1 | 6/2020 | Duckworth et al. | |
| 10,691,611 B2 | 6/2020 | Ray et al. | |
| 10,726,638 B2 | 7/2020 | Mondello et al. | |
| 10,728,265 B2 | 7/2020 | Hayden et al. | |
| 10,795,933 B1 | 10/2020 | Langley et al. | |
| 10,802,488 B1 | 10/2020 | Abeloe | |
| 10,824,145 B1 | 11/2020 | Konrardy et al. | |
| 10,860,924 B2 | 12/2020 | Burger | |
| 10,948,966 B1 | 3/2021 | Rotem et al. | |
| 10,970,395 B1 | 4/2021 | Bansal et al. | |
| 10,992,557 B1 | 4/2021 | Matthews et al. | |
| 10,993,647 B2 | 5/2021 | Kale et al. | |
| 11,010,233 B1 | 5/2021 | Golden et al. | |
| 11,042,350 B2 | 6/2021 | Bielby et al. | |
| 11,093,766 B1 | 8/2021 | Kale et al. | |
| 11,250,648 B2 | 2/2022 | Kale et al. | |
| 11,275,696 B2 | 3/2022 | Ray et al. | |
| 11,361,552 B2 | 6/2022 | Kale et al. | |
| 11,409,654 B2 | 8/2022 | Bielby et al. | |
| 11,435,945 B2 | 9/2022 | Yamazaki et al. | |
| 11,435,946 B2 | 9/2022 | Bielby et al. | |
| 11,436,076 B2 | 9/2022 | Kale et al. | |
| 11,498,388 B2 | 11/2022 | Kale et al. | |
| 11,531,339 B2 | 12/2022 | Bielby et al. | |
| 11,586,194 B2 | 2/2023 | Bielby et al. | |
| 11,586,943 B2 | 2/2023 | Kale et al. | |
| 11,635,893 B2 | 4/2023 | Kale et al. | |
| 11,650,746 B2 | 5/2023 | Kale et al. | |
| 11,693,562 B2 | 7/2023 | Kale et al. | |
| 11,702,086 B2 | 7/2023 | Bielby et al. | |
| 11,709,625 B2 | 7/2023 | Kale et al. | |
| 11,748,626 B2 | 9/2023 | Kale et al. | |
| 11,775,816 B2 | 10/2023 | Bielby et al. | |
| 11,830,296 B2 | 11/2023 | Kale et al. | |
| 11,853,863 B2 | 12/2023 | Bielby et al. | |
| 12,061,971 B2 | 8/2024 | Bielby et al. | |
| 12,066,947 B2 | 8/2024 | Bielby et al. | |
| 2001/0002936 A1 | 6/2001 | Tsuji et al. | |
| 2002/0007237 A1 | 1/2002 | Phung et al. | |
| 2002/0039950 A1 | 4/2002 | Graf et al. | |
| 2003/0160104 A1 | 8/2003 | Kelly et al. | |
| 2003/0188091 A1 | 10/2003 | Wyatt et al. | |
| 2004/0036261 A1 | 2/2004 | Breed | |
| 2004/0090314 A1 | 5/2004 | Iwamoto | |
| 2004/0143380 A1 | 7/2004 | Stam et al. | |
| 2004/0193347 A1 | 9/2004 | Harumoto et al. | |
| 2005/0089177 A1 | 4/2005 | Hughes et al. | |
| 2005/0100191 A1 | 5/2005 | Harbach et al. | |
| 2005/0125117 A1 | 6/2005 | Breed | |
| 2005/0201565 A1 | 9/2005 | Choi et al. | |
| 2005/0270178 A1 | 12/2005 | Ioli | |
| 2005/0285758 A1 | 12/2005 | Matsukawa et al. | |
| 2006/0069849 A1 | 3/2006 | Rudelic | |
| 2006/0292841 A1 | 12/2006 | Quick | |
| 2007/0008151 A1 | 1/2007 | Victor et al. | |
| 2007/0063548 A1 | 3/2007 | Eipper | |
| 2007/0065002 A1 | 3/2007 | Marzell et al. | |
| 2007/0140030 A1 | 6/2007 | Wyatt | |
| 2007/0200671 A1 | 8/2007 | Kelley et al. | |
| 2007/0279493 A1 | 12/2007 | Edanami | |
| 2008/0007567 A1 | 1/2008 | Clatworthy et al. | |
| 2008/0036187 A1 | 2/2008 | Breed | |
| 2008/0140918 A1 | 6/2008 | Sutardja | |
| 2008/0147265 A1 | 6/2008 | Breed | |
| 2008/0177683 A1 | 7/2008 | No et al. | |
| 2008/0238694 A1 | 10/2008 | Ishida | |
| 2008/0260239 A1 | 10/2008 | Han et al. | |
| 2009/0112582 A1 | 4/2009 | Kuwagaki et al. | |
| 2009/0141575 A1 | 6/2009 | Kohler et al. | |
| 2009/0198396 A1 | 8/2009 | Rodriguez et al. | |
| 2009/0324010 A1 | 12/2009 | Hou | |
| 2009/0326841 A1 | 12/2009 | Zhang et al. | |
| 2010/0064111 A1 | 3/2010 | Kunimatsu et al. | |
| 2010/0109881 A1 | 5/2010 | Eskandarian et al. | |
| 2010/0191391 A1 | 7/2010 | Zeng | |
| 2010/0214105 A1 | 8/2010 | Manotas, Jr. | |
| 2011/0009107 A1 | 1/2011 | Guba et al. | |
| 2011/0029738 A1 | 2/2011 | Clark et al. | |
| 2011/0172879 A1 | 7/2011 | Abe | |
| 2012/0001547 A1 | 1/2012 | Nishitani et al. | |
| 2012/0035778 A1 | 2/2012 | Kong | |
| 2012/0041914 A1 | 2/2012 | Tirunagari | |
| 2012/0047312 A1 | 2/2012 | Nathuji et al. | |

(56) References Cited

U.S. PATENT DOCUMENTS

| | | |
|---|---|---|
| 2012/0066439 A1 | 3/2012 | Fillingim |
| 2012/0069131 A1 | 3/2012 | Abelow |
| 2012/0084532 A1 | 4/2012 | Mackenna et al. |
| 2012/0245791 A1 | 9/2012 | Yun et al. |
| 2012/0296512 A1 | 11/2012 | Lee et al. |
| 2013/0046432 A1 | 2/2013 | Edwards et al. |
| 2013/0097128 A1 | 4/2013 | Suzuki et al. |
| 2013/0204484 A1 | 8/2013 | Ricci |
| 2013/0227380 A1 | 8/2013 | Mittelholzer et al. |
| 2014/0036076 A1 | 2/2014 | Nerayoff et al. |
| 2014/0132423 A1 | 5/2014 | Choi et al. |
| 2014/0222288 A1 | 8/2014 | Lavoie et al. |
| 2014/0236472 A1 | 8/2014 | Rosario |
| 2014/0344203 A1 | 11/2014 | Ahn |
| 2015/0046060 A1 | 2/2015 | Nikovski et al. |
| 2015/0052093 A1 | 2/2015 | Canoy et al. |
| 2015/0053066 A1 | 2/2015 | Hampiholi et al. |
| 2015/0116146 A1 | 4/2015 | Dickman |
| 2015/0178620 A1 | 6/2015 | Ascari et al. |
| 2015/0195518 A1 | 7/2015 | Shikii et al. |
| 2015/0206014 A1 | 7/2015 | Wu et al. |
| 2015/0217449 A1 | 8/2015 | Meier et al. |
| 2015/0269482 A1 | 9/2015 | Annapureddy et al. |
| 2015/0324285 A1 | 11/2015 | Murphy et al. |
| 2015/0347038 A1 | 12/2015 | Monteleone et al. |
| 2016/0052524 A1 | 2/2016 | Kim et al. |
| 2016/0096506 A1 | 4/2016 | Shreve et al. |
| 2016/0098632 A1 | 4/2016 | Sutskever et al. |
| 2016/0099684 A1 | 4/2016 | Qiu et al. |
| 2016/0144866 A1 | 5/2016 | Seo |
| 2016/0195029 A1 | 7/2016 | Bizub |
| 2016/0202147 A1 | 7/2016 | Svantesson et al. |
| 2016/0203377 A1 | 7/2016 | Yie et al. |
| 2016/0224888 A1 | 8/2016 | Kozloski |
| 2016/0321176 A1 | 11/2016 | Yoo et al. |
| 2016/0343180 A1 | 11/2016 | Talwar et al. |
| 2016/0349330 A1 | 12/2016 | Barfield, Jr. et al. |
| 2016/0359893 A1 | 12/2016 | Kishikawa et al. |
| 2017/0031329 A1 | 2/2017 | Inagaki et al. |
| 2017/0031816 A1 | 2/2017 | Lee et al. |
| 2017/0125099 A1 | 5/2017 | Qawami et al. |
| 2017/0126428 A1 | 5/2017 | Paryani et al. |
| 2017/0132512 A1 | 5/2017 | Ioffe |
| 2017/0158023 A1 | 6/2017 | Stevanovic et al. |
| 2017/0166055 A1 | 6/2017 | Maylone et al. |
| 2017/0169625 A1 | 6/2017 | Lavie et al. |
| 2017/0172520 A1 | 6/2017 | Kannan et al. |
| 2017/0177965 A1 | 6/2017 | Gordo Soldevila et al. |
| 2017/0217424 A1 | 8/2017 | Park |
| 2017/0236027 A1 | 8/2017 | Van Der et al. |
| 2017/0278330 A1 | 9/2017 | Buttolo et al. |
| 2017/0300788 A1 | 10/2017 | Cao et al. |
| 2017/0323201 A1 | 11/2017 | Sutskever et al. |
| 2017/0327094 A1 | 11/2017 | Inoue et al. |
| 2017/0337466 A1 | 11/2017 | Bayat et al. |
| 2017/0344299 A1 | 11/2017 | Ivanov |
| 2017/0352245 A1 | 12/2017 | Maher et al. |
| 2017/0352267 A1 | 12/2017 | Tzirkel-Hancock et al. |
| 2017/0358151 A1 | 12/2017 | Koons et al. |
| 2017/0371340 A1 | 12/2017 | Cohen et al. |
| 2017/0371349 A1 | 12/2017 | Kim et al. |
| 2018/0009444 A1 | 1/2018 | Grimm et al. |
| 2018/0010818 A1* | 1/2018 | Maruyama ............... F24F 11/30 |
| 2018/0026454 A1 | 1/2018 | Belkacem-boussaid et al. |
| 2018/0027231 A1 | 1/2018 | Shikii et al. |
| 2018/0033280 A1 | 2/2018 | Taylor |
| 2018/0046894 A1 | 2/2018 | Yao |
| 2018/0052025 A1 | 2/2018 | Gao et al. |
| 2018/0075344 A1 | 3/2018 | Ma et al. |
| 2018/0101483 A1 | 4/2018 | Catthoor et al. |
| 2018/0108369 A1 | 4/2018 | Gross |
| 2018/0120843 A1 | 5/2018 | Berntorp et al. |
| 2018/0121377 A1 | 5/2018 | Woo et al. |
| 2018/0121879 A1 | 5/2018 | Zhang et al. |
| 2018/0122456 A1 | 5/2018 | Li et al. |
| 2018/0126901 A1 | 5/2018 | Levkova et al. |
| 2018/0134116 A1 | 5/2018 | Chen et al. |
| 2018/0143762 A1 | 5/2018 | Kim et al. |
| 2018/0144815 A1 | 5/2018 | Chapman-mcquiston et al. |
| 2018/0152317 A1 | 5/2018 | Chang et al. |
| 2018/0173961 A1 | 6/2018 | Jain et al. |
| 2018/0173971 A1 | 6/2018 | Jia et al. |
| 2018/0181144 A1 | 6/2018 | Steinmann et al. |
| 2018/0181822 A1 | 6/2018 | Chang et al. |
| 2018/0186376 A1 | 7/2018 | Lee et al. |
| 2018/0197349 A1 | 7/2018 | Oesterling et al. |
| 2018/0211121 A1 | 7/2018 | Moosaei et al. |
| 2018/0237029 A1 | 8/2018 | Bansal et al. |
| 2018/0260641 A1 | 9/2018 | Yadhunandan et al. |
| 2018/0272992 A1 | 9/2018 | Gage et al. |
| 2018/0276911 A1 | 9/2018 | Mcafee et al. |
| 2018/0284737 A1 | 10/2018 | Cella et al. |
| 2018/0286258 A1 | 10/2018 | Derbanne |
| 2018/0288086 A1 | 10/2018 | Amiri et al. |
| 2018/0295147 A1 | 10/2018 | Haga et al. |
| 2018/0300477 A1 | 10/2018 | Galula et al. |
| 2018/0304716 A1 | 10/2018 | Veca et al. |
| 2018/0304806 A1 | 10/2018 | Kim |
| 2018/0304807 A1 | 10/2018 | Boesch et al. |
| 2018/0307972 A1 | 10/2018 | Feng et al. |
| 2018/0308203 A1 | 10/2018 | Appu et al. |
| 2018/0314928 A1 | 11/2018 | Li et al. |
| 2018/0314936 A1 | 11/2018 | Barik et al. |
| 2018/0322365 A1 | 11/2018 | Yehezkel Rohekar |
| 2018/0322385 A1 | 11/2018 | Yehezkel Rohekar et al. |
| 2018/0322386 A1 | 11/2018 | Sridharan et al. |
| 2018/0322711 A1 | 11/2018 | Weimerskirch |
| 2018/0350351 A1 | 12/2018 | Kopys et al. |
| 2018/0350366 A1 | 12/2018 | Park et al. |
| 2018/0354646 A1* | 12/2018 | Nakhjavani ............. G01M 1/22 |
| 2018/0357535 A1 | 12/2018 | Shulkin et al. |
| 2018/0365089 A1 | 12/2018 | Okanohara et al. |
| 2018/0367553 A1 | 12/2018 | Hayden et al. |
| 2019/0005376 A1 | 1/2019 | Akin et al. |
| 2019/0018415 A1 | 1/2019 | Netter |
| 2019/0042407 A1 | 2/2019 | Gao et al. |
| 2019/0042910 A1 | 2/2019 | Krishnamurthy et al. |
| 2019/0042920 A1 | 2/2019 | Akin et al. |
| 2019/0042945 A1 | 2/2019 | Majumdar et al. |
| 2019/0043514 A1 | 2/2019 | Maziewski et al. |
| 2019/0050160 A1* | 2/2019 | Dardis ................. G06F 3/0673 |
| 2019/0065386 A1 | 2/2019 | Park |
| 2019/0065410 A1 | 2/2019 | Bigioi et al. |
| 2019/0065867 A1 | 2/2019 | Huang et al. |
| 2019/0066399 A1 | 2/2019 | Jiang et al. |
| 2019/0077409 A1 | 3/2019 | Zandi et al. |
| 2019/0092308 A1 | 3/2019 | Graves |
| 2019/0092337 A1 | 3/2019 | Chua et al. |
| 2019/0102640 A1 | 4/2019 | Balasubramanian |
| 2019/0103162 A1 | 4/2019 | Asnaashari et al. |
| 2019/0114078 A1 | 4/2019 | Oh |
| 2019/0114538 A1 | 4/2019 | Ng et al. |
| 2019/0116157 A1 | 4/2019 | Kishikawa et al. |
| 2019/0120910 A1 | 4/2019 | Ghantous et al. |
| 2019/0121575 A1 | 4/2019 | Della Monica et al. |
| 2019/0122110 A1 | 4/2019 | Ruckauer et al. |
| 2019/0122661 A1 | 4/2019 | Hansen et al. |
| 2019/0129405 A1 | 5/2019 | Cella et al. |
| 2019/0135300 A1 | 5/2019 | Gonzalez Aguirre et al. |
| 2019/0147015 A1 | 5/2019 | Zhang et al. |
| 2019/0147051 A1 | 5/2019 | Lu et al. |
| 2019/0155520 A1 | 5/2019 | Gervais |
| 2019/0155678 A1 | 5/2019 | Hsiong et al. |
| 2019/0171178 A1 | 6/2019 | Burke et al. |
| 2019/0171928 A1 | 6/2019 | Young |
| 2019/0175411 A1 | 6/2019 | Awiszus et al. |
| 2019/0179685 A1 | 6/2019 | Ki |
| 2019/0184916 A1 | 6/2019 | Troia et al. |
| 2019/0187291 A1 | 6/2019 | Troia |
| 2019/0188141 A1 | 6/2019 | Ma et al. |
| 2019/0188573 A1* | 6/2019 | Lehman ................. G06N 3/063 |
| 2019/0197795 A1 | 6/2019 | Mondello et al. |
| 2019/0205739 A1 | 7/2019 | Liu et al. |
| 2019/0205744 A1 | 7/2019 | Mondello et al. |

(56) References Cited

U.S. PATENT DOCUMENTS

| | | |
|---|---|---|
| 2019/0205745 A1 | 7/2019 | Sridharan et al. |
| 2019/0205765 A1 | 7/2019 | Mondello et al. |
| 2019/0212967 A1 | 7/2019 | Stanley et al. |
| 2019/0215339 A1 | 7/2019 | Chen |
| 2019/0219995 A1 | 7/2019 | Cella et al. |
| 2019/0221257 A1 | 7/2019 | Jeng et al. |
| 2019/0236861 A1 | 8/2019 | Amendolagine et al. |
| 2019/0243771 A1 | 8/2019 | Mittal et al. |
| 2019/0244442 A1 | 8/2019 | Kyes et al. |
| 2019/0250069 A1 | 8/2019 | Samadani et al. |
| 2019/0265764 A1 | 8/2019 | Ping |
| 2019/0279447 A1 | 9/2019 | Ricci |
| 2019/0279478 A1 | 9/2019 | Ebata |
| 2019/0286414 A1 | 9/2019 | Langos |
| 2019/0293014 A1 | 9/2019 | Fosaaen et al. |
| 2019/0294929 A1 | 9/2019 | Yao et al. |
| 2019/0303567 A1 | 10/2019 | Batmaz et al. |
| 2019/0319868 A1* | 10/2019 | Svennebring ....... H04L 43/0882 |
| 2019/0324432 A1 | 10/2019 | Cella et al. |
| 2019/0324444 A1 | 10/2019 | Cella et al. |
| 2019/0325374 A1 | 10/2019 | Pan et al. |
| 2019/0332109 A1 | 10/2019 | Kolouri et al. |
| 2019/0333291 A1 | 10/2019 | Liu et al. |
| 2019/0339396 A1 | 11/2019 | Turunen |
| 2019/0339706 A1 | 11/2019 | Batur |
| 2019/0339980 A1 | 11/2019 | Sity et al. |
| 2019/0354238 A1* | 11/2019 | Akhbari ................ G06F 3/0436 |
| 2019/0361808 A1 | 11/2019 | Subramanian et al. |
| 2019/0362725 A1 | 11/2019 | Himmelstein |
| 2019/0367049 A1 | 12/2019 | Oba |
| 2019/0392309 A1 | 12/2019 | Bhatnagar et al. |
| 2020/0007672 A1 | 1/2020 | Reyes et al. |
| 2020/0013285 A1 | 1/2020 | Wang |
| 2020/0019510 A1 | 1/2020 | Ray et al. |
| 2020/0023846 A1 | 1/2020 | Husain et al. |
| 2020/0035045 A1 | 1/2020 | Kim et al. |
| 2020/0050555 A1 | 2/2020 | Kim et al. |
| 2020/0051564 A1 | 2/2020 | Chae et al. |
| 2020/0053112 A1 | 2/2020 | Torisaki et al. |
| 2020/0062275 A1 | 2/2020 | Higgins et al. |
| 2020/0070657 A1 | 3/2020 | Kim |
| 2020/0074297 A1 | 3/2020 | Lee et al. |
| 2020/0082852 A1 | 3/2020 | Golov |
| 2020/0094651 A1 | 3/2020 | Ostrowski et al. |
| 2020/0110547 A1 | 4/2020 | Lee et al. |
| 2020/0133533 A1 | 4/2020 | Zhao et al. |
| 2020/0133845 A1 | 4/2020 | Kim et al. |
| 2020/0134833 A1 | 4/2020 | Biswas et al. |
| 2020/0134939 A1 | 4/2020 | Schell et al. |
| 2020/0159445 A1 | 5/2020 | Kachare et al. |
| 2020/0164763 A1 | 5/2020 | Holme |
| 2020/0202151 A1 | 6/2020 | Wacquant |
| 2020/0205735 A1* | 7/2020 | Narayanan ............. G06F 3/017 |
| 2020/0209848 A1 | 7/2020 | Mercep et al. |
| 2020/0210807 A1 | 7/2020 | Lorrain et al. |
| 2020/0214614 A1 | 7/2020 | Rundo et al. |
| 2020/0231182 A1 | 7/2020 | Oba |
| 2020/0240670 A1 | 7/2020 | Kitagawa et al. |
| 2020/0267171 A1 | 8/2020 | Mozumdar et al. |
| 2020/0272815 A1 | 8/2020 | Cao et al. |
| 2020/0285997 A1 | 9/2020 | Bhattacharyya et al. |
| 2020/0286358 A1 | 9/2020 | Doi et al. |
| 2020/0293200 A1 | 9/2020 | Das et al. |
| 2020/0294401 A1 | 9/2020 | Kerecsen |
| 2020/0298757 A1 | 9/2020 | Thompson et al. |
| 2020/0311537 A1 | 10/2020 | Franca-neto et al. |
| 2020/0312056 A1 | 10/2020 | Wang et al. |
| 2020/0317211 A1 | 10/2020 | Stiller et al. |
| 2020/0319998 A1 | 10/2020 | Wang et al. |
| 2020/0326871 A1 | 10/2020 | Wu et al. |
| 2020/0334924 A1 | 10/2020 | Wells et al. |
| 2020/0336541 A1 | 10/2020 | Naderi Alizadeh et al. |
| 2020/0356292 A1 | 11/2020 | Ippatapu |
| 2020/0369410 A1 | 11/2020 | Rice |
| 2020/0379659 A1* | 12/2020 | Faibish ................ G06F 3/0641 |
| 2020/0379908 A1 | 12/2020 | Curewitz et al. |
| 2020/0380354 A1 | 12/2020 | Zhao et al. |
| 2020/0380369 A1 | 12/2020 | Case et al. |
| 2020/0394495 A1 | 12/2020 | Moudgill et al. |
| 2021/0005027 A1 | 1/2021 | Handiaz et al. |
| 2021/0012297 A1 | 1/2021 | Johnson et al. |
| 2021/0019633 A1 | 1/2021 | Venkatesh |
| 2021/0019650 A1 | 1/2021 | Hsu et al. |
| 2021/0024076 A1 | 1/2021 | Chen et al. |
| 2021/0034048 A1 | 2/2021 | Hajizadeh |
| 2021/0048808 A1 | 2/2021 | Bielby et al. |
| 2021/0048949 A1 | 2/2021 | Kale et al. |
| 2021/0049444 A1 | 2/2021 | Bielby et al. |
| 2021/0049445 A1 | 2/2021 | Bielby et al. |
| 2021/0049457 A1 | 2/2021 | Bielby et al. |
| 2021/0049471 A1 | 2/2021 | Kale et al. |
| 2021/0049479 A1 | 2/2021 | Kale et al. |
| 2021/0049480 A1 | 2/2021 | Kale et al. |
| 2021/0049833 A1 | 2/2021 | Bielby et al. |
| 2021/0049834 A1 | 2/2021 | Kale et al. |
| 2021/0049839 A1 | 2/2021 | Bielby et al. |
| 2021/0052206 A1 | 2/2021 | Kale et al. |
| 2021/0053418 A1 | 2/2021 | Kale et al. |
| 2021/0053574 A1 | 2/2021 | Bielby et al. |
| 2021/0053575 A1 | 2/2021 | Bielby et al. |
| 2021/0055352 A1 | 2/2021 | Takahashi et al. |
| 2021/0055907 A1 | 2/2021 | Bielby et al. |
| 2021/0056315 A1 | 2/2021 | Kale et al. |
| 2021/0056323 A1 | 2/2021 | Pfeiffer et al. |
| 2021/0061027 A1 | 3/2021 | Da Deppo et al. |
| 2021/0064054 A1 | 3/2021 | Bang et al. |
| 2021/0072901 A1 | 3/2021 | Kale et al. |
| 2021/0072911 A1 | 3/2021 | Kale et al. |
| 2021/0072921 A1 | 3/2021 | Bielby et al. |
| 2021/0073063 A1 | 3/2021 | Kale et al. |
| 2021/0073127 A1 | 3/2021 | Bielby et al. |
| 2021/0097506 A1 | 4/2021 | Gulati et al. |
| 2021/0110015 A1 | 4/2021 | Mccarty et al. |
| 2021/0127090 A1 | 4/2021 | Kale et al. |
| 2021/0142146 A1 | 5/2021 | Kale et al. |
| 2021/0147182 A1 | 5/2021 | Cheung et al. |
| 2021/0150685 A1 | 5/2021 | Chen et al. |
| 2021/0179117 A1 | 6/2021 | Glazman et al. |
| 2021/0181010 A1 | 6/2021 | Schneider |
| 2021/0192860 A1 | 6/2021 | Kale et al. |
| 2021/0201003 A1 | 7/2021 | Banerjee et al. |
| 2021/0213935 A1 | 7/2021 | Lu et al. |
| 2021/0221434 A1 | 7/2021 | Liu et al. |
| 2021/0222662 A1 | 7/2021 | Do |
| 2021/0228131 A1 | 7/2021 | Kale et al. |
| 2021/0241011 A1 | 8/2021 | Cronje et al. |
| 2021/0255620 A1 | 8/2021 | Bielby et al. |
| 2021/0255799 A1 | 8/2021 | Kale et al. |
| 2021/0256349 A1 | 8/2021 | Bielby et al. |
| 2021/0269046 A1 | 9/2021 | Hashimoto et al. |
| 2021/0271446 A1 | 9/2021 | Bielby et al. |
| 2021/0288357 A1 | 9/2021 | Kuriki et al. |
| 2021/0309183 A1 | 10/2021 | Bielby et al. |
| 2021/0325949 A1 | 10/2021 | Kale et al. |
| 2021/0326692 A1 | 10/2021 | Golov et al. |
| 2021/0362664 A1 | 11/2021 | Yang et al. |
| 2022/0032932 A1 | 2/2022 | Kale et al. |
| 2022/0050593 A1 | 2/2022 | Kim et al. |
| 2022/0108148 A1 | 4/2022 | Moudgill et al. |
| 2022/0114843 A1 | 4/2022 | Kale et al. |
| 2022/0137567 A1 | 5/2022 | Kogo et al. |
| 2022/0148342 A1 | 5/2022 | Fagergren et al. |
| 2022/0188555 A1 | 6/2022 | Park |
| 2022/0237469 A1 | 7/2022 | Mondello et al. |
| 2022/0286365 A1* | 9/2022 | Palaios ................ H04W 24/08 |
| 2022/0301318 A1 | 9/2022 | Kale et al. |
| 2023/0004327 A1 | 1/2023 | Bielby et al. |
| 2023/0064819 A1 | 3/2023 | Yoshizawa et al. |

(56) References Cited

U.S. PATENT DOCUMENTS

| | | |
|---|---|---|
| 2023/0143515 A1 | 5/2023 | Ito et al. |
| 2024/0071146 A1 | 2/2024 | Kale et al. |

FOREIGN PATENT DOCUMENTS

| | | |
|---|---|---|
| CN | 101063629 | 10/2007 |
| CN | 101348065 | 1/2009 |
| CN | 101519073 | 9/2009 |
| CN | 102024999 | 4/2011 |
| CN | 102692918 | 9/2012 |
| CN | 102951144 | 3/2013 |
| CN | 103575536 | 2/2014 |
| CN | 104149845 | 11/2014 |
| CN | 104155118 | 11/2014 |
| CN | 104199432 | 12/2014 |
| CN | 104536435 | 4/2015 |
| CN | 104569747 | 4/2015 |
| CN | 104698399 | 6/2015 |
| CN | 104777762 | 7/2015 |
| CN | 105243393 | 1/2016 |
| CN | 105354986 | 2/2016 |
| CN | 105719359 | 6/2016 |
| CN | 205483568 | 8/2016 |
| CN | 106203642 | 12/2016 |
| CN | 106227122 | 12/2016 |
| CN | 106250981 | 12/2016 |
| CN | 106447383 | 2/2017 |
| CN | 106485317 | 3/2017 |
| CN | 106529670 | 3/2017 |
| CN | 106530623 | 3/2017 |
| CN | 106681250 | 5/2017 |
| CN | 106710145 | 5/2017 |
| CN | 106740572 | 5/2017 |
| CN | 107024331 | 8/2017 |
| CN | 107215307 | 9/2017 |
| CN | 107221323 | 9/2017 |
| CN | 107554528 | 1/2018 |
| CN | 107878450 | 4/2018 |
| CN | 107901909 | 4/2018 |
| CN | 107948307 | 4/2018 |
| CN | 108146344 | 6/2018 |
| CN | 108372785 | 8/2018 |
| CN | 108423004 | 8/2018 |
| CN | 108597057 | 9/2018 |
| CN | 108639054 | 10/2018 |
| CN | 108646707 | 10/2018 |
| CN | 108734270 | 11/2018 |
| CN | 108749596 | 11/2018 |
| CN | 108791299 | 11/2018 |
| CN | 108860211 | 11/2018 |
| CN | 108881254 | 11/2018 |
| CN | 108960065 | 12/2018 |
| CN | 109061224 | 12/2018 |
| CN | 109086888 | 12/2018 |
| CN | 109283469 | 1/2019 |
| CN | 109299784 | 2/2019 |
| CN | 109443766 | 3/2019 |
| CN | 109447048 | 3/2019 |
| CN | 109470254 | 3/2019 |
| CN | 109624992 | 4/2019 |
| CN | 109910863 | 6/2019 |
| CN | 109920082 | 6/2019 |
| CN | 110077414 | 8/2019 |
| CN | 110174885 | 8/2019 |
| CN | 110422172 | 11/2019 |
| CN | 110775065 | 2/2020 |
| EP | 3748453 | 12/2020 |
| EP | 3947080 | 2/2022 |
| JP | S63314347 | 12/1988 |
| JP | H04363641 | 12/1992 |
| JP | H1142922 | 2/1999 |
| JP | 2000321176 | 11/2000 |
| JP | 2001133295 | 5/2001 |
| JP | 2005160194 | 6/2005 |
| JP | 2005199955 | 7/2005 |
| JP | 2008062832 | 3/2008 |
| JP | 2012071622 | 4/2012 |
| JP | 2015063270 | 4/2015 |
| JP | 2018199402 | 12/2018 |
| JP | 2019040431 | 3/2019 |
| KR | 20190051465 | 5/2019 |
| WO | 2009112847 | 9/2009 |
| WO | 2017097798 | 6/2017 |
| WO | 2018065890 | 4/2018 |
| WO | 2021174122 | 9/2021 |
| WO | 2022112920 | 6/2022 |

OTHER PUBLICATIONS

Maass, Wolfgang. "Networks of spiking neurons: The third generation of neural network models." Neural Networks, vol. 10, Issue 9, 1997.

Wikipedia, "Spiking Neural Network." Retrieved from the Internet <https://en.wikipedia.org/w/index.php?title=Spiking_neural_network&oldid=908070304>, Jul. 27, 2019.

Pavlo, Andrew, et al., "Self-Driving Database Management Systems." CIDR, vol. 4, 2017.

Schuiki, Fabian, et al., "A Scalable Near-Memory Architecture for Training Deep Neural Networks on Large In-Memory Datasets." 24th IEEE Conference on Mass Storage Systems and Technologies (MSST 2007), 2007.

Bangalore, Pramod, et al., "An Artificial Neural Network Approach for Early Fault Detection of Gearbox Bearings." IEEE, Mar. 2, 2015.

Davies, Mike, et al., "Loihi: a Neuromorphic Manycore Processor with On-Chip Learning." IEEE Micro, vol. 38, No. 1, Jan./Feb. 2018.

Fu, Xiu-wei, et al., "Research on fault diagnosis for steer-by-wire system based on particle swarm optimization neural network." China Academic Journal Electronic Publishing House, Sep. 30, 2010.

Fabiola Martins Campos de Oliveira, et al. "Partitioning Convolutional Neural Networks to Maximize the Inference Rate on Constrained IoT Devices." Future Internet, Sep. 29, 2019.

Igor Belic. "Neural Networks and Statis Modelling." Institute of Metals and Technology, 2012.

Michael Pfeiffer, et al. "Deep Learning With Spiking Neurons: Opportunities and Challenges." Frontiers in Neuroscience, Oct. 25, 2018.

S.R. Nandakumar, et al. "Supervised Learning in Spiking Neural Networks with MLC PCM Synapses." IEEE, 2017.

Sai Sha, et al. "A Neural Network Model for Cache and Memory Prediction of Neural Networks." IEEE, 2018.

Yao, Jiangyun, et al., "Research on the New Method for Fault Intelligent Diagnosis of Steer-by-wire System." China Academic Journal Electronic Publishing House, Nov. 30, 2014.

Zhang, Wenyu, "Internet of Things Intelligent Technology." China Railway Publishing House, Apr. 30, 2012.

Ahmad, Ijaz, et al., "Machine Learning Meets Communication Networks: Current Trends and Future Challenges." IEEE, Dec. 1, 2020.

Capra, Maurizio, et al., "Hardware and Software Optimizations for Accelerating Deep Neural Networks: Survey of Current Trends, Challenges, and the Road Ahead." IEEE, Nov. 24, 2020.

Automotive Predictive Maintenance, U.S. Appl. No. 16/53 8,006, filed Aug. 12, 2019, Robert Bielby et al., Non Final Action Mailed Status, Jul. 19, 2022.

Storage Devices With Neural Network Accelerators for Automotive Predictive Maintenance, U.S. Appl. No. 16/538,011, filed Aug. 12, 2019, Poorna Kale et al., Docketed New Case—Ready for Examination, May 25, 2022.

Storage and Access of Neural Network Models of Automotive Predictive Maintenance, U.S. Appl. No. 16/538,015, filed Aug. 12, 2019, Robert Bielby et al., Non Final Action Mailed, Jul. 1, 2022.

Storage and Access of Neural Network Inputs in Automotive Predictive Maintenance, U.S. Appl. No. 16/538,073, filed Aug. 12, 2019, Poorna Kale et al., Non Final Action Mailed, Jun. 9, 2022.

(56) References Cited

OTHER PUBLICATIONS

Storage and Access of Neural Network Outputs in Automotive Predictive Maintenance, U.S. Appl. No. 16/538,078, filed Aug. 12, 2019, Robert Bielby et al., Non Final Action Mailed, Aug. 18, 2022.
Communications Between Processors and Storage Devices in Automotive Predictive Maintenance Implemented via Artificial Neural Networks, U.S. Appl. No. 16/538,087, filed Aug. 12, 2019, Poorna Kale et al., Non Final Action Mailed, May 26, 2022.
Predictive Maintenance of Automotive Engines, U.S. Appl. No. 16/53 8,092, filed Aug. 12, 2019, Robert Bielby et al., Response to Non-Final Office Action Entered and Forwarded to Examiner, May 2, 2022.
Predictive Maintenance of Automotive Battery, U.S. Appl. No. 16/538,097, filed Aug. 12, 2019, Poorna Kale et al., Non Final Action Mailed, Jun. 6, 2022.
Drowsiness Detection for Vehicle Control, U.S. Appl. No. 16/547,136, filed Aug. 21, 2019, Poorna Kale et al., Patented Case, Aug. 7, 2020.
Drowsiness Detection For Vehicle Control, U.S. Appl. No. 17/231,836, filed Apr. 15, 2021, Poorna Kale et al., Docketed New Case—Ready for Examination, Aug. 23, 2021.
Predictive Maintenance of Automotive Powertrain, U.S. Appl. No. 16/538,103, filed Aug. 12, 2019, Robert Bielby et al., Non Final Action Mailed, May 26, 2022.
Predictive Maintenance of Automotive Lighting, U.S. Appl. No. 16/53 8,108, filed Aug. 12, 2019, Poorna Kale et al., Docketed New Case—Ready for Examination, Sep. 25, 2019.
Predictive Maintenance of Automotive Tires, U.S. Appl. No. 16/538,121, filed Aug. 12, 2019, Robert Bielby et al., Response to Non-Final Office Action Entered and Forwarded to Examiner, Apr. 27, 2022.
Monitoring Controller Area Network Bus for Vehicle, U.S. Appl. No. 16/547,149, filed Aug. 21, 2019, Robert Bielby et al., Non Final Action Mailed, Aug. 10, 2022.
Intelligent Climate Control in Vehicles, U.S. Appl. No. 16/547,165, filed Aug. 21, 2019, Poorna Kale et al., Notice of Allowance Mailed—Application Received in Office of Publications, Mar. 18, 2022.
Intelligent Audio Control in Vehicles U.S. Appl. No. 16/547,177, filed Aug. 21, 2019, Robert Bielby et al., Patented Case, Sep. 30, 2020.
Intelligent Audio Control in Vehicles, U.S. Appl. No. 17/321,351, filed May 14, 2021, Robert Bielby et al., Non Final Action Mailed, Sep. 23, 2022.
Security Operations of Parked Vehicles, U.S. Appl. No. 16/547,185, filed Aug. 21, 2019, Poorna Kale et al., Patented Case, Oct. 13, 2021.
Security Operations of Parked Vehicles, U.S. Appl. No. 17/837,915, filed Jun. 10, 2022, Poorna Kale et al., Docketed New Case—Ready for Examination, Jun. 16, 2022.
Intelligent Recording of Errant Vehicle Behaviors, U.S. Appl. No. 16/547,199, filed Aug. 21, 2019, Robert Bielby et al., Non Final Action Mailed, Aug. 3, 2022.
Optimization of Quality of Service of Data Storage Devices, U.S. Appl. No. 16/791,851, filed Feb. 14, 2020, Robert Bielby et al., Docketed New Case—Ready for Examination, Aug. 20, 2021.
Predictive Maintenance of Automotive Transmission, U.S. Appl. No. 16/719,181, filed Dec. 18, 2019, Poorna Kale et al., Patented Case, Jan. 26, 2022.
Predictive Maintenance of Automotive Transmission, U.S. Appl. No. 17/556,515, filed Dec. 20, 2021, Poorna Kale et al., Docketed New Case—Ready for Examination, Jan. 4, 2022.
Monitoring of Drive by Wire Sensors in Vehicles, U.S. Appl. No. 16/791,870, filed Feb. 14, 2020, Robert Bielby et al., Notice of Allowance Mailed—Application Received in Office of Publication, Mar. 30, 2022.
Optimization of Power Usage of Data Storage Devices, U.S. Appl. No. 16/791,887, filed Feb. 14, 2020, Poorna Kale et al., Final Rejection Mailed, Jul. 22, 2022.
Predictive Management of Failing Portions in a Data Storage Device, U.S. Appl. No. 16/562,211, filed Sep. 5, 2019, Poorna Kale et al., Patented Case, Jan. 21, 2022.
Intelligent Optimization of Caching Operations in a Data Storage Device, U.S. Appl. No. 16/562,213, filed Sep. 5, 2019, Robert Bielby et al., Patented Case, Dec. 27, 2021.
Intelligent Write-Amplification Reduction for Data Storage Devices Configured on Autonomous Vehicles, U.S. Appl. No. 16/562,222, filed Sep. 5, 2019, Poorna Kale et al., Non Final Action Mailed, Jul. 28, 2022.
Intelligent Wear Leveling with Reduced Write-Amplification for Data Storage Devices Configured on Autonomous Vehicles, U.S. Appl. No. 16/562,225, filed Sep. 5, 2019, Robert Bielby et al., Patented Case, Jan. 20, 2022.
Intelligent Wear Leveling with Reduced Write-amplification for Data Storage Devices Configured on Autonomous Vehicles, U.S. Appl. No. 17/899,407, filed Aug. 30, 2022, Robert Bielby et al., Application Undergoing Preexam Processing, Aug. 30, 2022.
Bandwidth Optimization for Different Types of Operations Scheduled in a Data Storage Device, U.S. Appl. No. 16/562,230, filed Sep. 5, 2019, Poorna Kale et al., Non Final Action Mailed, Aug. 5, 2022.
Dong, Zeng-Shou, "The Fault Diagnosis Technique for the Concrete Pump Truck." Chinese Doctoral Dissertation Full Text Database Engineering Science and Technology, abstract only, Aug. 15, 2013.
Li, Lianjiang, "Research on GPU based Spiking Neural Network Learning." China's Excellent Master's Degree Thesis Full-text Database (Information Technology Series), Abstract only, Jun. 15, 2017.
Li, Yang, et al., "Convolutional Recurrent Neural Network-based Channel Equalization: An Experimental Study." IEEE, Dec. 31, 2017.
Xu, Yingnan, "Research on Accelerating Optimization and Automatic Generation Technology for Artificial Neural Network." Chinese Excellent Master's Thesis Full-text Database Information Technology Series, p. ii, Abstract only, Jan. 15, 2019.
Chicca, Elisabetta, et al., "Neuromorphic Electronic Circuits for Building Autonomous Cognitive Systems." Proceedings of the IEEE, IEEE, Sep. 30, 2014.
Xue, Tianzhi, "VLSI Architecture Design for Spiking Convolutional Neural Network." Chinese Excellent Master's Thesis Full Text Database Information Technology Series, Abstract only, Aug. 15, 2019.
Yu, Lei, "Research of Spiking Deep Neural Network Hardware Implementation Based on FPGA and System on Chip." Chinese Excellent Master's Thesis Full Text Database Information Technology Series, Abstract only, Mar. 15, 2017.
Xue, Jinlin, et al., "Velocity Tracking Control Based on Reinforcement Learning Neural Network." Measurement & Control Technology, Issue 07, Abstract Only, Jul. 18, 2007.

* cited by examiner

TEMPERATURE BASED OPTIMIZATION OF DATA STORAGE OPERATIONS

FIELD OF THE TECHNOLOGY

At least some embodiments disclosed herein relate to data storage devices in general and more particularly, but not limited to, optimization of operations of data storage devices installed in vehicles.

BACKGROUND

Recent developments in the technological area of autonomous driving allow a computing system to operate, at least under some conditions, control elements of a motor vehicle without the assistance from a human operator of the vehicle.

For example, sensors (e.g., cameras and radars) can be installed on a motor vehicle to detect the conditions of the surroundings of the vehicle traveling on a roadway. A computing system installed on the vehicle analyzes the sensor inputs to identify the conditions and generate control signals or commands for the autonomous adjustments of the direction and/or speed of the vehicle, with or without any input from a human operator of the vehicle.

In some arrangements, when a computing system recognizes a situation where the computing system may not be able to continue operating the vehicle in a safe manner, the computing system alerts the human operator of the vehicle and requests the human operator to take over the control of the vehicle and drive manually, instead of allowing the computing system to drive the vehicle autonomously.

Autonomous driving and/or advanced driver assistance system (ADAS) typically involves artificial neural network (ANN) for the identification of events and/or objects that are captured in sensor inputs.

In general, an artificial neural network (ANN) uses a network of neurons to process inputs to the network and to generate outputs from the network.

For example, each neuron in the network receives a set of inputs. Some of the inputs to a neuron may be the outputs of certain neurons in the network; and some of the inputs to a neuron may be the inputs provided to the neural network. The input/output relations among the neurons in the network represent the neuron connectivity in the network.

For example, each neuron can have a bias, an activation function, and a set of synaptic weights for its inputs respectively. The activation function may be in the form of a step function, a linear function, a log-sigmoid function, etc. Different neurons in the network may have different activation functions.

For example, each neuron can generate a weighted sum of its inputs and its bias and then produce an output that is the function of the weighted sum, computed using the activation function of the neuron.

The relations between the input(s) and the output(s) of an ANN in general are defined by an ANN model that includes the data representing the connectivity of the neurons in the network, as well as the bias, activation function, and synaptic weights of each neuron. Using a given ANN model a computing device computes the output(s) of the network from a given set of inputs to the network.

For example, the inputs to an ANN network may be generated based on camera inputs; and the outputs from the ANN network may be the identification of an item, such as an event or an object.

A spiking neural network (SNN) is a type of ANN that closely mimics natural neural networks. An SNN neuron produces a spike as output when the activation level of the neuron is sufficiently high. The activation level of an SNN neuron mimics the membrane potential of a natural neuron. The outputs/spikes of the SNN neurons can change the activation levels of other neurons that receive the outputs. The current activation level of an SNN neuron as a function of time is typically modeled using a differential equation and considered the state of the SNN neuron. Incoming spikes from other neurons can push the activation level of the neuron higher to reach a threshold for spiking. Once the neuron spikes, its activation level is reset. Before the spiking, the activation level of the SNN neuron can decay over time, as controlled by the differential equation. The element of time in the behavior of SNN neurons makes an SNN suitable for processing spatiotemporal data. The connectivity of SNN is often sparse, which is advantageous in reducing computational workload.

In general, an ANN may be trained using a supervised method where the parameters in the ANN are adjusted to minimize or reduce the error between known outputs resulted from respective inputs and computed outputs generated from applying the inputs to the ANN. Examples of supervised learning/training methods include reinforcement learning, and learning with error correction.

Alternatively, or in combination, an ANN may be trained using an unsupervised method where the exact outputs resulted from a given set of inputs is not known before the completion of the training. The ANN can be trained to classify an item into a plurality of categories, or data points into clusters.

Multiple training algorithms can be employed for a sophisticated machine learning/training paradigm.

BRIEF DESCRIPTION OF THE DRAWINGS

The embodiments are illustrated by way of example and not limitation in the figures of the accompanying drawings in which like references indicate similar elements.

DETAILED DESCRIPTION

At least some embodiments disclosed herein provide systems, methods and apparatus to process sensor data generated in a motor vehicle, or another vehicle with or without an advanced driver assistance system (ADAS).

Before a component of a motor vehicle breaks down or malfunctions during the operation of a vehicle, there can be indication of whether the component needs replacement or maintenance. Such indications may not be noticeable to a typical driver or passengers. However, sensor data can be collected and analyzed to predict the probability of component failures. The prediction can be used to schedule maintenance services, which can reduce or eliminate the chances of incidents where a component of a vehicle breaks down or malfunctions during the operation of the vehicle on a roadway. Further, the prediction allows the service trip to be scheduled at a convenient time.

For example, sensors can be installed in an automotive system to collect data during its routine operations; and the sensor data can be used to predict whether and how soon a component needs replacement or maintenance. The sensor data can be provided as input to an artificial neural network (ANN) (e.g., spiking neural network (SNN)) of an artificial intelligent (AI) system to train itself (e.g., using an unsupervised machine learn technique) in a time period in which the vehicle is expected to operate normally. The training customizes the neural network for the specific operating environment(s) of the driver, passenger, or user of the vehicle and the personalized operating habits of the vehicle occupant(s). Subsequently, when the operating data deviates the normal mode, the artificial neural network can detect abnormal conditions. The AI system can be used to suggest a maintenance service and/or identify the component that likely needs replacement or maintenance.

Figure 1:
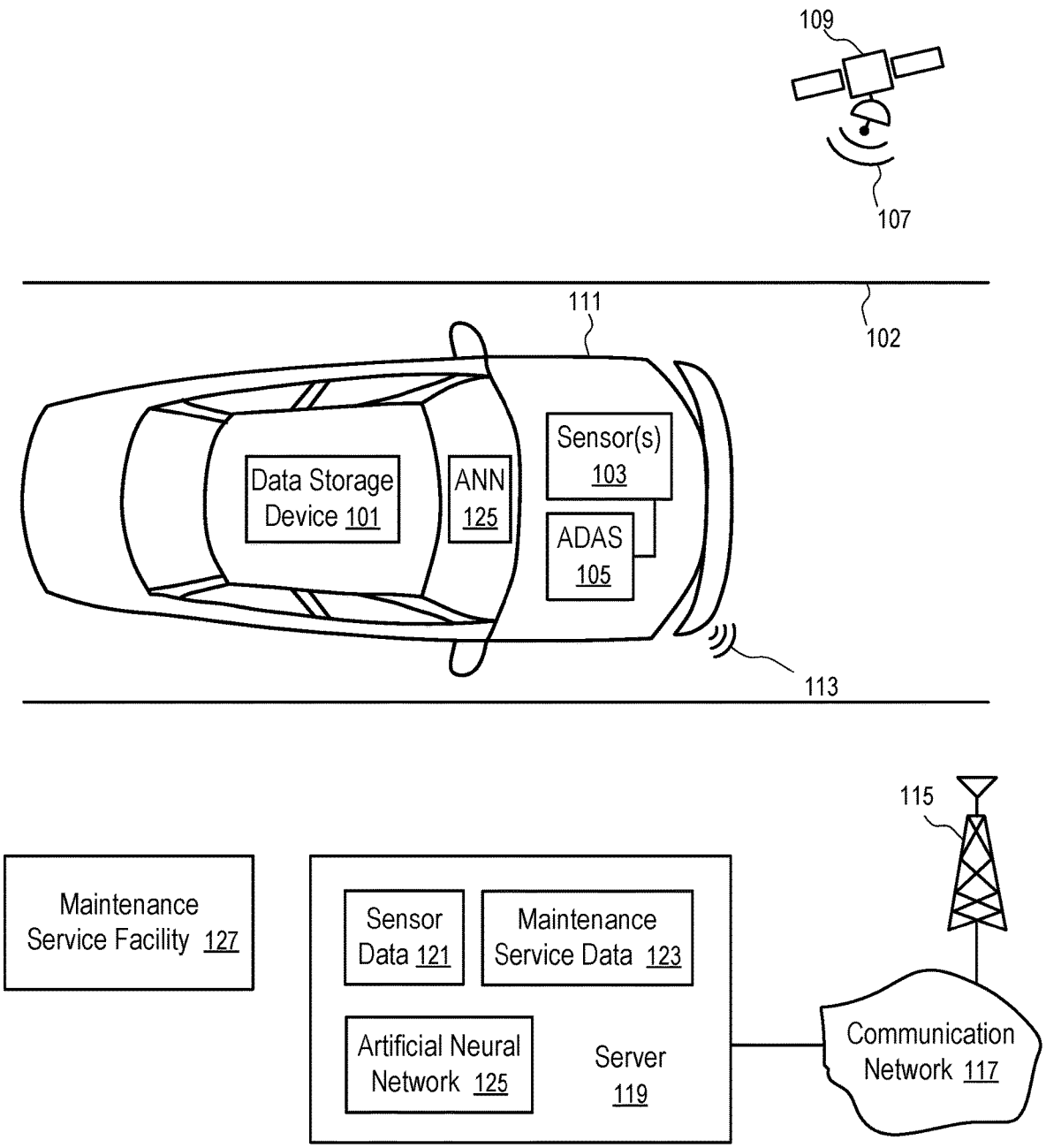
FIG. 1 shows a system in which a vehicle is configured with a data storage device to collect and process sensor data according to some embodiments.

FIG. 1 shows a system in which a vehicle is configured with a data storage device to collect and process sensor data according to some embodiments.

The system of FIG. 1 includes a vehicle (111) having a data storage device (101). Optionally, the vehicle (111) has an advanced driver assistance system (ADAS) (105) and one or more sensors (103) that provide senor data input to the ADAS (105) and/or the data storage device (101). The data storage device (101) is configured to use an artificial neural network (ANN) (125) to predict/identify a need for a maintenance service based on the data collected by the sensors (103). The ADAS (105) can be omitted without impacting the predictive maintenance features. In some implementations, at least a portion of the data generate by the sensors (103) is used in both the ADAS (105) for driver assistance and in the ANN (125) for maintenance prediction. Optionally, the output of the ANN (124) can be used in both the data storage device (101) and in the ADAS (105).

The sensor(s) (103) can include digital cameras, lidars, radars, ultrasound sonars, brake sensors, speed sensors, acceleration sensors, airbag sensors, a GPS (global positioning system) receiver, audio sensors/microphones, vibration sensors, force/stress sensors, deformation sensors, motion sensors, temperature sensors, etc. Some of the sensors (103) can be configured primarily to monitor the environment of the vehicle (111); and other sensors (103) can be configured primarily to monitor the operating condition of one or more component of the vehicle (111), such as an internal combustion engine, an exhaust system, an electric motor, a brake, a tire, a battery, etc.

The outputs of the sensor(s) (103) as a function of time are provided as a sensor data stream to the ADAS (105) and/or the ANN (125) to provide driver assistance (e.g., autonomous driving) and maintenance prediction.

For example, the vehicle (111) can have a wireless communication device to communicate with a remote server (119) via wireless signals (113) and a communication network (117). The remote server (119) is typically configured at a location away from a road (102) on which the vehicle (111) is in service. For example, the vehicle (111) may provide some sensor data (121) to the server (119) and receive update of the ANN (125) from the server (119).

One example of the communication network (117) is a cell phone network having one or more base stations (e.g., 115) to receive the wireless signals (e.g., 113). Another example of the communication network (117) is internet, where the wireless local area network signals (e.g., 113) transmitted by the vehicle (113) is received in an access point (e.g., 115) for further communication to the server (119). In some implementations, the vehicle (111) uses a communication link (107) to a satellite (109) or a communication balloon to communicate with the server (119).

The server (119) can also communicate with one or more maintenance service facilities (e.g., 127) to receive maintenance service data (123) of vehicles (e.g., 111). The maintenance service data (123) can include inspection records and/or service records of components of the vehicles (e.g., 111). For example, the inspection records and/or service records can indicate the degree of wear and tear of components inspected during their services at the maintenance service facilities (e.g., 127), the identification of failed or malfunctioning components, etc. The sensor data (121) of the vehicles (e.g., 111) in a time period prior to the services and the maintenance service data (123) can be used to train an ANN (125) to predict the probability of a component requiring a maintenance service. The updated ANN (125) can be used to predict and suggest a maintenance service for a vehicle (111) based on sensor data (121) received in a recent period of time. Alternatively, the update ANN (125) can be transmitted to the vehicle (111); and the vehicle (111) can used the data generated from the sensors (103) during routine operations of the vehicle (111) to predict and suggest a maintenance service.

The data storage device (101) of the vehicle (111) can be configured to record sensor data for a period of time that can be used in the ANN for predictive maintenance. Maintenance prediction is typically for a relative long period of time (e.g., a few days, weeks and/or months). In contrast, sensor data recorded for the review of an accident, collision, or near collision involving an autonomous vehicle is typically for a short period of time (e.g., 30 seconds to a few minutes). Thus, a typical black box data recorder configured to record sensor data for the review/analysis of an accident or collision is insufficient for predictive maintenance.

Optionally, the data storage device (101) stores the sensor data of a period of time leading to a trip to a maintenance service facility (e.g., 127). The maintenance service facility (e.g., 127) can download the sensor data (121) from the data storage device (101) and provide the sensor data (121) and the corresponding maintenance service data (123) to the server (119) to facilitate the training of the ANN (125).

Optionally, or in combination, the data storage device (101) is configured with a machine learning module to customize and/or train the ANN (125) installed in the vehicle (111) for predictive maintenance.

For example, the machine learning module of the data storage device (101) can be used to calibrate the ANN (125) to account for the typical/daily environment in which the vehicle (111) is being operated and/or driving preferences/habits of the driver(s) of the vehicle (111).

For example, during a period of time when the vehicle is expected to be operated under typical/daily environment with healthy components, the sensor data generated by the sensors (103) can be used to train the ANN (125) to recognize the patterns of sensor data that represents trouble free operations. Such patterns can vary for different vehicles (e.g., 111) based on their routine operating environments and the driving habits/characteristics of their drivers. The training allows the ANN (125) to detect deviations from the recognized normal patterns and report anomaly for maintenance predictions.

For example, the ANN (125) can include an SNN configured to classify time-based variations of sensor data and/or detect deviation from known patterns of sensor data of the vehicle (111) operated in the normal/healthy condition but in a personalized environment (e.g., a daily route of a driver/passenger) and/or operated under a personalized driving habit/pattern.

Figure 2:
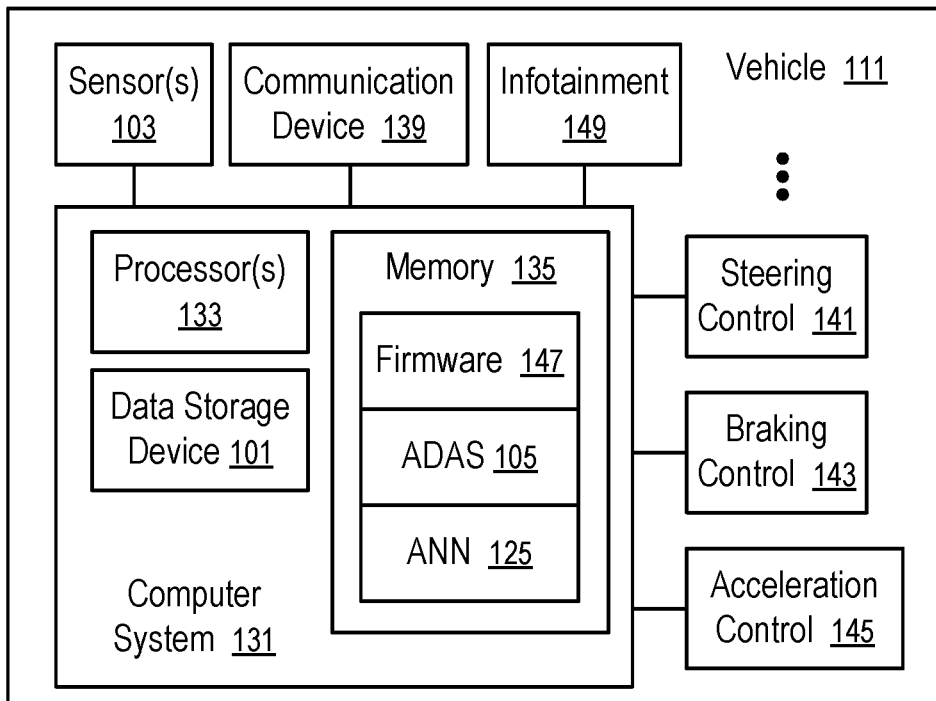
FIG. 2 shows an autonomous vehicle having a data storage device according to one embodiment.

FIG. 2 shows an autonomous vehicle (111) having a data storage device (101) according to one embodiment. For example, the vehicle (111) in the system of FIG. 1 can be implemented using the autonomous vehicle (111) of FIG. 2.

The vehicle (111) of FIG. 2 is configured to have an advanced driver assistance system (ADAS) (105). The ADAS (105) of the vehicle (111) can have an Artificial Neural Network (ANN) (125) for object detection, recognition, identification, and/or classification. The ANN (125) and/or another neural network (e.g., configured in the data storage device (101)) can be used to predict the probability of a component of the vehicle (111) requiring a maintenance service (e.g., repair, replacement, or adjustment).

Preferably, the data storage device (101) is configured to process sensor data at least partially for predictive maintenance with reduced computation burden on the processors (133) that are tasked to operate the ADAS (105) and/or other components, such as an infotainment system (149).

The vehicle (111) typically includes an infotainment system (149), a communication device (139), one or more sensors (103), and a computer system (131) that is connected to some controls of the vehicle (111), such as a steering control (141) for the direction of the vehicle (111), a braking control (143) for stopping of the vehicle (111), an acceleration control (145) for the speed of the vehicle (111), etc. In some embodiments, the vehicle (111) in the system of FIG. 1 has a similar configuration and/or similar components.

Some of the sensors (103) are required for the operations of the ADAS (105); and some of the sensors (103) are used to collect data related to the health of the components of the vehicle (111), which may not be used in the ADAS (105). Optionally, the sensor data generated by the sensors (103) can also be used to predict the likelihood of imminent failure of a component. Such a prediction can be used in the ADAS (105) to take emergency actions to render the vehicle in a safe state (e.g., by reducing speed and/or pulling off to park).

The computer system (131) of the vehicle (111) includes one or more processors (133), a data storage device (101), and memory (135) storing firmware (or software) (147), including the computer instructions and data models for ADAS (105).

The one or more sensors (103) of the vehicle can include a visible light camera, an infrared camera, a lidar, radar, or sonar system, a peripheral sensor, a global positioning system (GPS) receiver, a satellite positioning system receiver, a brake sensor, and/or an airbag sensor. Further, the sensors (103) can include audio sensors (e.g., microphone) configured to monitor noises from various components and locations in the vehicle (111), a vibration sensor, a pressure sensor, a force sensor, a stress sensor, and/or a deformation sensor configured to measure loads on a component of the vehicle (111), accelerometers and/or gyroscope sensors measuring the motions of some components of the vehicle (111), etc. Such sensors can be used to monitor the operating status and/or health of the components for predictive maintenance.

The sensor(s) (103) can provide a stream of real time sensor data to the computer system (131). The sensor data generated by a sensor (103) of the vehicle (111) can include an image that captures an object using a camera that images using lights visible to human eyes, or a camera that images using infrared lights, or a sonar, radar, or LIDAR system. Image data obtained from at least one sensor of the vehicle is part of the collected sensor data for recording in the data storage device (101) and/or as input to the ANN (125). For example, a camera can be used to obtain roadway information for the travel of the vehicle (111), which can be processed by the ANN (125) to generate control signals for the vehicle (111). For example, a camera can be used to monitor the operation state/health of a component of the vehicle (111), which can be processed by the ANN (125) to predict or schedule a maintenance service.

The sensor data generated by a sensor (103) of the vehicle (111) can include an audio stream that captures the characteristics of sounds at a location on the vehicle (111), such as a location near an engine, a motor, a transmission system, a wheel, a door, a window, etc. The audio data obtained from at least one sensor (103) of the vehicle (111) can be part of the collected sensor data for recording in the data storage device (101) and/or as input to the ANN (125). For example, the audio stream can be used to monitor the operation state/health of a component of the vehicle (111) (e.g., an internal combustion engine, an exhaust system, an electric motor, a brake), which can be processed by the ANN (125) to predict or schedule a maintenance service.

The infotainment system (149) can be used to present the predicted or schedule maintenance service. Optionally, the communication device (139) can establish a connection to a mobile device of the driver of the vehicle (111) to inform the driver of the recommended maintenance service and/or the recommended data of the service, to calendar the appointment, etc.

When the vehicle (111) is configured with an ADAS (105), the outputs of the ADAS (105) can be used to control (e.g., (141), (143), (145)) the acceleration of the vehicle (111), the speed of the vehicle (111), and/or the direction of the vehicle (111), during autonomous driving.

Figure 3:
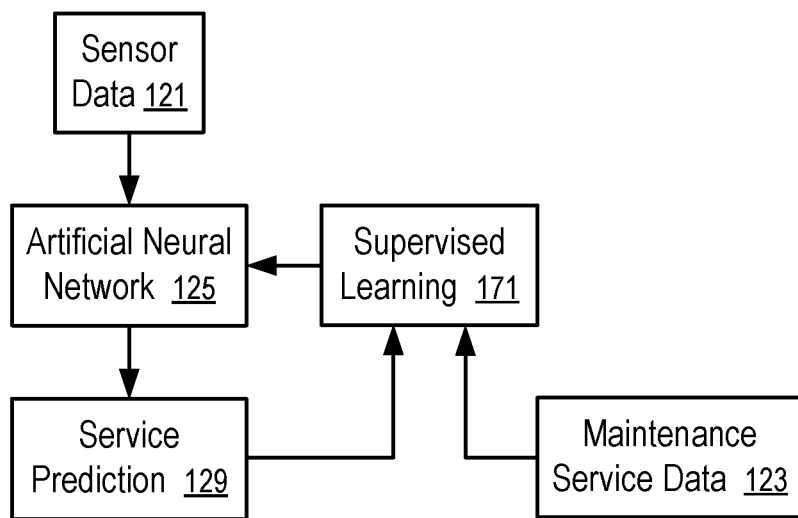
FIGS. 3-5 illustrate training of artificial neural networks for maintenance service prediction according to some embodiments.
Figure 4:
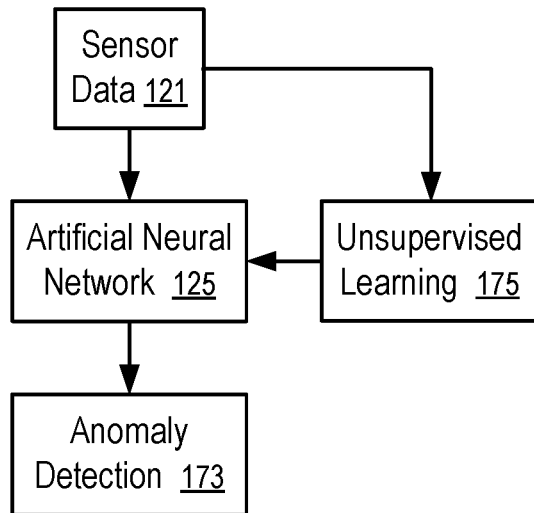
Figure 5:
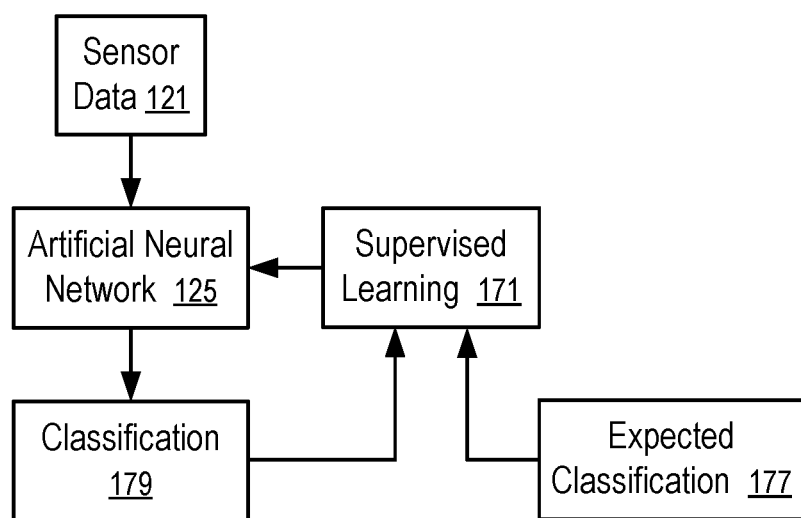

FIGS. 3-5 illustrate training of artificial neural networks for maintenance service prediction according to some embodiments.

In FIG. 3, a module (171) of supervised machine learning is used to train an artificial neural network (125) to minimize the differences between the service prediction (129) generated from the sensor data (121) and the maintenance service data (123).

For example, the maintenance service data (123) can identify the measured wear and tear of a component as a function of time to predict a time to a recommended service. The sensor data (121) can be used in the ANN (125) to generate a predicted time to the recommended service. The supervised machine learning module (171) can adjust the artificial neural network (125) to reduce/minimize the difference between the time predicted based on the sensor data (121) and the time computed from the measurement of wear and tear.

For example, the maintenance service data (123) can identify a component that is replaced or repaired in the maintenance service facility (127). The sensor data (121) recorded for a time period prior to the replacement or repair of the component can be used to calculate the times to the replacement or repair. Further, the segments of the stream of sensor data in the time period before the replacement or repair can be used in the ANN (125) to generate a prediction to the time of the replacement or repair. The supervised learning (171) can be used to adjust the ANN (125) to reduce the predicted time to the replacement or repair and the actual time to the replacement or repair.

The supervised learning (171) of FIG. 2 can be applied in the server (119) based on the sensor data of a population of vehicles and their maintenance service data (123) to generate a generic ANN for the population of the vehicles.

The supervised learning (171) of FIG. 2 can be applied in the vehicle (111) based on the sensor data of the vehicle and its maintenance service data (123) to generate a customized/personalized ANN for the population of the vehicles. For example, a generic ANN can be initially used in the vehicle (111); and the sensor data of the vehicle (111) and its maintenance service data (123) can be used to further train the ANN (125) of the vehicle for customization/personalization of the ANN (125) in the vehicle (111).

In FIG. 4, a module (175) of unsupervised machine learning is used to train or refine an artificial neural network (125) to facilitate anomaly detection (173). The unsupervised machine learning module (175) is configured to adjust the ANN (e.g., SNN) the classification, clustering, or recognized pattern in the sensor data (121) such that a degree of deviation from the classification, clustering, or recognized pattern in the sensor data (121) generated in a recent time period can be used to signal the detection (173) of anomaly. Anomaly detection (173) allows the vehicle (111) to be scheduled for inspection in a maintenance service facility (127). Optionally, after the inspection, maintenance service data (123) can be used to apply a supervised learning (171) to generate more precise predictions to a service, as in FIG. 3.

Typically, a vehicle (111) can be assumed to be operating in a normal/healthy condition in a certain time period. For example, after a new vehicle (111) is initially delivered for service, the vehicle (111) can be assumed to provide trouble-free services for at least a period of time (e.g., a few months). For example, after a time period following the replacement or repair of a component, the component can be assumed to provide trouble-free service for at least a period of time (e.g., a few months or a year). Thus, the sensor data (121) obtained during this period of time can be pre-classified as "normal" to train the ANN (125) using an unsupervised learning (175) as in FIG. 4, or a supervised learning (171) as in FIG. 5.

For example, the sensor data (121) collected via during the "normal" service time period of the vehicle (111) or a component can be classified via an unsupervised learning (175) into a number of clusters. Different clusters may correspond to different types of normal conditions (e.g., traveling on different routes, on roads with different surface conditions, on days with different whether conditions, in different time periods of a day, different days in a week, different mood of driving habits of the driver). When a subsequent sensor data (121) is classified outside of the "normal" clusters, an anomaly is detected.

Optionally, a supervised machine learning (171) can be used to train the ANN (125), as illustrated in FIG. 5. During the "normal" service period of the vehicle (111) or a component, an expected classification (177) can be used to label the sensor data (121). The supervised learning (171) can be used to minimize the classification differences between the predictions (179) made using the ANN (125) according to the sensor data (121) and the expected classification (177). Further, when the sensor data (121) is known to be "abnormal" (e.g., after a diagnosis made in the maintenance service facility (127) or by the user, driver, or passenger of the vehicle (111)), the expected classification (177) can be changed to "abnormal" for further training of the ANN (125) for direct recognition of the anomaly (e.g., instead of relying upon deviation from known "normal" clusters for an inference of anomaly).

Thus, the ANN (125) can be trained to identify abnormal sensor data and estimate the degree of severity in anomaly to schedule a maintenance service.

Figure 6:
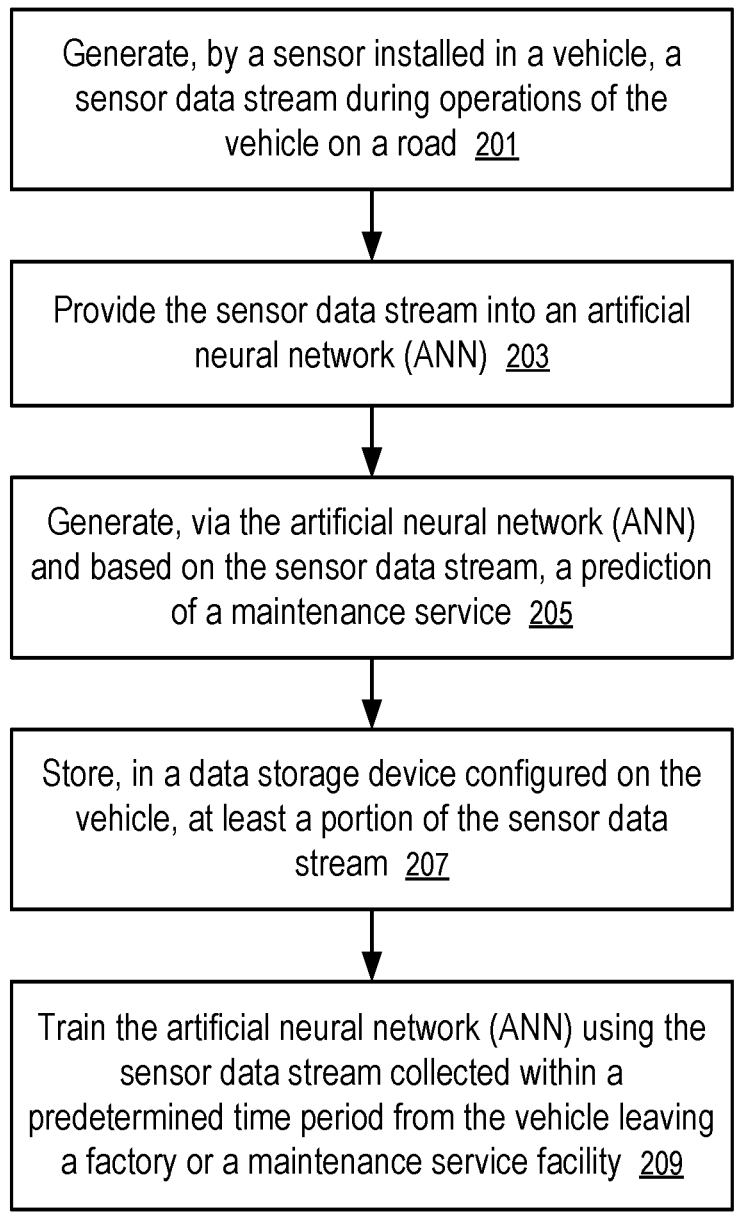
FIG. 6 shows a method of predictive maintenance according to one embodiment.

FIG. 6 shows a method of predictive maintenance according to one embodiment. For example, the method of FIG. 6 can be implemented in the data storage device (101) of FIG. 1 or 2 in the vehicle (111) or in a computer system (131) in the vehicle (111) of FIG. 2.

At block 201, a sensor (e.g., 103) installed in a vehicle (111) generates a sensor data stream (e.g., 121) during operations of the vehicle (111) on a road (102).

At block 203, the sensor data stream (e.g., 121) is provided into an artificial neural network (ANN) (125). For example, the ANN (125) can include a spiking neural network (SNN).

At block 205, the artificial neural network (ANN) (125) generates, based on the sensor data stream (e.g., 121), a prediction of a maintenance service.

At block 207, a data storage device (101) configured on the vehicle stores at least a portion of the sensor data stream (e.g., 121).

At block 209, the artificial neural network (ANN) is trained using the sensor data stream (e.g., 121) collected within a predetermined time period from the vehicle leaving a factory or a maintenance service facility (127).

For example, the artificial neural network (ANN) can be configured to identify a component of the vehicle (111) that needs repair or replacement in the maintenance service and/or identify a predicted time period to failure or malfunctioning of the component, or a suggested time period to a recommended maintenance service of the component prior the failure or malfunctioning of the component. Thus, the performance of the predicted maintenance service can avoid an incident of failure or malfunctioning of the component while the vehicle (111) operates on the road (102).

For example, the sensor (103) can be a microphone mounted in vicinity of the component, a vibration sensor attached to the component, a pressure sensor installed in the component, a force or stress sensor mounted on or attached to the component, a deformation sensor attached to the component, an accelerometer configured to measure motion parameters of the component.

Optionally, the data storage device (101), the computer system (131) of the vehicle (111), and/or a server (119) remote from the vehicle can have a machine learning module configured to train the artificial neural network (ANN) (125) during a period of time in which the vehicle (111) is assumed to be in a healthy state, such as a predetermined time period from the vehicle (111) leaving a factory or a maintenance service facility (127).

For example, the machine learning module can use an unsupervised machine learning (175) to train the ANN (125) to recognize/classify normal patterns of sensor data (121) and thus to have the capability to detect anomaly based on deviation from the normal patterns, as illustrated in FIG. 4. Alternatively, supervised machine learning (171) can be used, as illustrated in FIG. 3 or 5.

For example, unsupervised machine learning (175) can be applied by the data storage device (101) or the computer system (131) of the vehicle (111) during the predetermined period of time in which the vehicle and/or the component is known to be operating without troubles or degradations.

Alternatively, or in combination, some of the sensor data (121) stored in the data storage device (101) of the vehicle (111) can be uploaded to the server (119) for training the ANN (125).

In at least some embodiments disclosed herein, the data storage device (101) is configured to accelerate the computations of the artificial neural network (ANN) (125) of the vehicle (111).

For example, in addition to the typical operations to support data access and storage, the data storage device (101) can be further configured to perform at least part of the computations involving the artificial neural network (ANN) (125), such as the generation of the predictions (e.g., 129 or 173) or classifications (e.g., 179) from the sensor data (121) and/or the adjustment of the ANN (125) through unsupervised machine learning (175) (e.g., as illustrated in FIG. 4) and/or supervised machine learning (171) (e.g., as illustrated in FIG. 3 or 5).

For example, the computations configured in the data storage device (101) can be used to reduce the amount of data to be transmitted to the processor(s) (133) to use or apply the ANN (125) and/or reduce the computation tasks of the processor(s) (133) in evaluating the outputs of the ANN (125) and/or in training the ANN (125). Such an arrangement can result in faster output from the data storage device (101) and/or lower energy usage, since the data would not have to be moved in and out of the memory to a dedicated, standalone neural network accelerator. The computation capability of the data storage device (101) in processing data related to the ANN (125) enables the computer system (131) of the motor vehicle (111) to monitor the health of the automotive components (e.g., in a non-real-time manner, or a pseudo-real-time manner), with reduced impact, or no impact, on the processing of mission critical tasks (e.g., autonomous driving by the ADAS (105)). Further, the computation capability of the data storage device (101) can be used to accelerate the processing of the sensor data for ADAS (105) and thus improve the processing of mission critical tasks.

Figure 7:
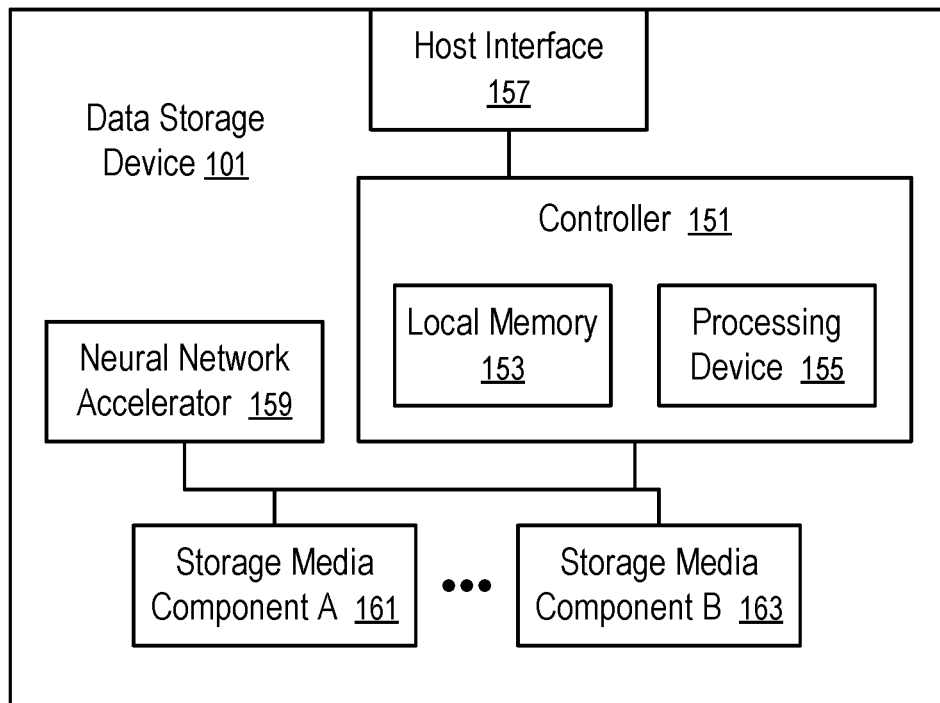
FIG. 7 shows a data storage device to accelerate neural network computations according to one embodiment.

FIG. 7 shows a data storage device (101) to accelerate neural network computations according to one embodiment. For example, the data storage device (101) of FIG. 7 can be used to implement the data storage device (101) of the vehicle (111) illustrated in FIG. 1 or 2.

In FIG. 7, the data storage device (101) has a host interface (157) configured to communicate with a processor (e.g., 133). For example, the communication between the processor (e.g., 133) and the host interface (157) can be, at least in part, in accordance with a communication protocol for a peripheral component interconnect express (PCIe) bus, a serial advanced technology attachment (SATA) bus, a universal serial bus (USB) bus, and/or a storage area network (SAN).

For example, the host interface (157) can be used to receive sensor data (121) generated by the sensors (103) of the vehicle (111) to optionally store a portion of the sensor data (121) in the storage media components (161 to 163).

For example, each of the storage media components (161 to 163) can be a memory integrated circuit configured to store data. For example, a media component (161 or 163) can include one or more integrated circuit dies embedded in an integrated circuit package. An integrated circuit die can have many memory units formed thereon to store data.

In general, some memory integrated circuits are volatile and require power to maintain the stored data; and some memory integrated circuits are non-volatile and can retain the stored data even when not powered.

Examples of non-volatile memory include flash memory, memory units formed based on negative-and (NAND) logic gates, negative-or (NOR) logic gates, phase-change memory (PCM), magnetic memory (MRAM), resistive random-access memory, cross point storage and memory devices. A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage. Further examples of non-volatile memory include Read-Only Memory (ROM), Programmable Read-Only Memory (PROM), Erasable Programmable Read-Only Memory (EPROM) and Electronically Erasable Programmable Read-Only Memory (EEPROM) memory, etc. Examples of volatile memory include Dynamic Random-Access Memory (DRAM) and Static Random-Access Memory (SRAM).

The data storage device (101) can have a controller (151) that includes volatile local memory (153) and at least one processing device (155).

The local memory of the controller (151) can be an embedded memory configured to store instructions for performing various processes, operations, logic flows, and routines that control operation of the processing device (155), including handling communications between the data storage device (101) and the processor(s) (e.g., 133) of the vehicle (111), and other functions described herein. The local memory (151) of the controller (151) can include read-only memory (ROM) for storing micro-code and/or memory registers storing, e.g., memory pointers, fetched data, etc., and/or volatile memory, such as Dynamic Random-Access Memory (DRAM) and Static Random-Access Memory (SRAM).

In FIG. 7, the data storage device (101) includes a neural network accelerator (159) coupled to the controller (151) and/or the storage media components (161 to 163).

For example, the neural network accelerator (159) can be configured to perform matrix arithmetic computations. The computations involving ANN (125) have matrix multiplication and accumulation operations, which can be computational intensive for a generic processor (e.g., 133). Using the neural network accelerator (159) to perform the matrix arithmetic computations can reduce the data to be transmitted to the processor(s) (133) of the vehicle (111) and reduce the computation workload for the processor(s) (133).

For example, when the ANN (125) includes a spiking neural network (SNN), the simulation of the differential equation(s) for controlling the activation level of SNN neurons can be computationally intensive for a generic processor (e.g., 133). The neural network accelerator (159) can use special hardware to simulate the differential equation(s) and thus improve the computational efficiency of the computer system (131) as a whole.

In some implementations, the neural network accelerator (159) is an integrated circuit device separate from the controller (151) and/or the storage media components (161 to 163). Alternatively, or in combination, a neural network accelerator (159) is integrated with the controller (151) in an integrated circuit package. Further, a neural network accelerator (159) can be integrated in at least one of the storage media components (161 to 163), as illustrated in FIG. 8.

Figure 8:
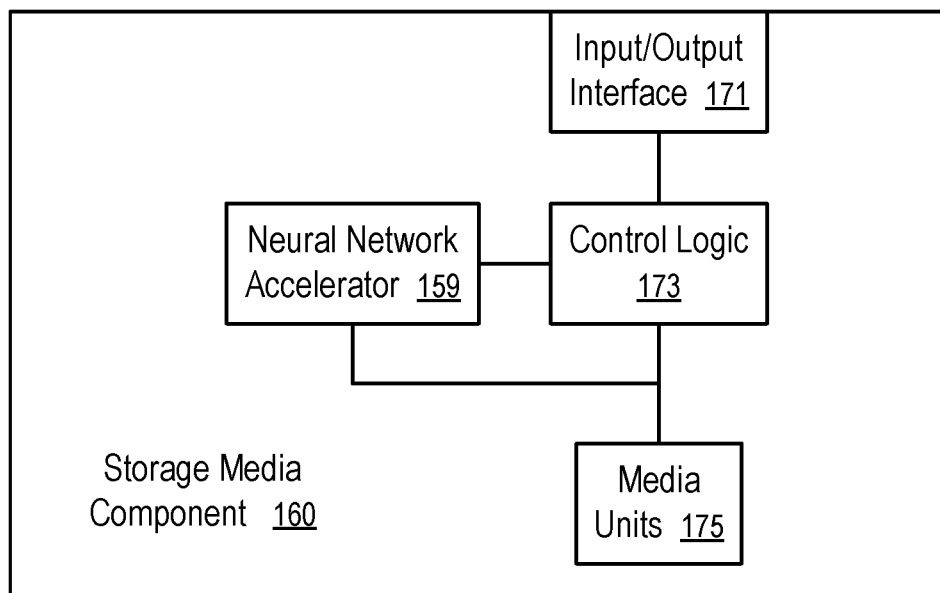
FIG. 8 shows a storage media component to accelerate neural network computations according to one embodiment.

FIG. 8 shows a storage media component (160) to accelerate neural network computations according to one embodiment. For example, each or some of the storage media components (161 to 163) in FIG. 7 can be implemented using a storage media component (160) of FIG. 8.

In FIG. 8, the storage media component (160) can be housed within an integrated circuit package. An input/output (I/O) interface (171) of the storage media component (160) is configured to process input/output signals in the pins of the integrated circuit package. For example, the input/output signals can include address signals to specify locations in the media units (175) and data signals representing data to be written in the media units (175) at the locations specified via the address signals, or data retrieved from the locations in the media units (175).

In FIG. 8, a neural network accelerator (159) is coupled with the control logic (173) and/or the media units (175) to perform computations that are used in the evaluation of the output of an ANN (125) and/or in the training of the ANN (125).

For example, the input/output interface (171) can receive addresses that identify matrices that are stored in the media units and that are to be operated upon via the neural network accelerator (159). The storage media component (160) can provide the computation results of the neural network accelerator (159) as the output data responsive to the addresses, store the output data in a buffer for further operations, store the output data into a location in the media units (175) specified via the address signals. Thus, the computations performed by the neural network accelerator (159) can be within the storage media component (160), which is close to the media units (175) in which the matrix data is stored. For example, each of the media units (175) can be an integrated circuit die on which memory units of non-volatile memory are formed.

For example, the state data of SNN neurons can be stored in the media units (175) according to a predetermined pattern. The neural network accelerator (159) can automatically update the states of the SNN neurons according to the differential equation(s) for controlling the activation level of SNN neurons over time. Optionally, the neural network accelerator (159) is configured to processing spiking of neurons in the neural network. Alternatively, the neural network accelerator (159) of the data storage device (101) and/or the processor(s) (133) can be configured to process the spiking of neurons and/or accumulation of inputs to the SNN.

Figure 9:
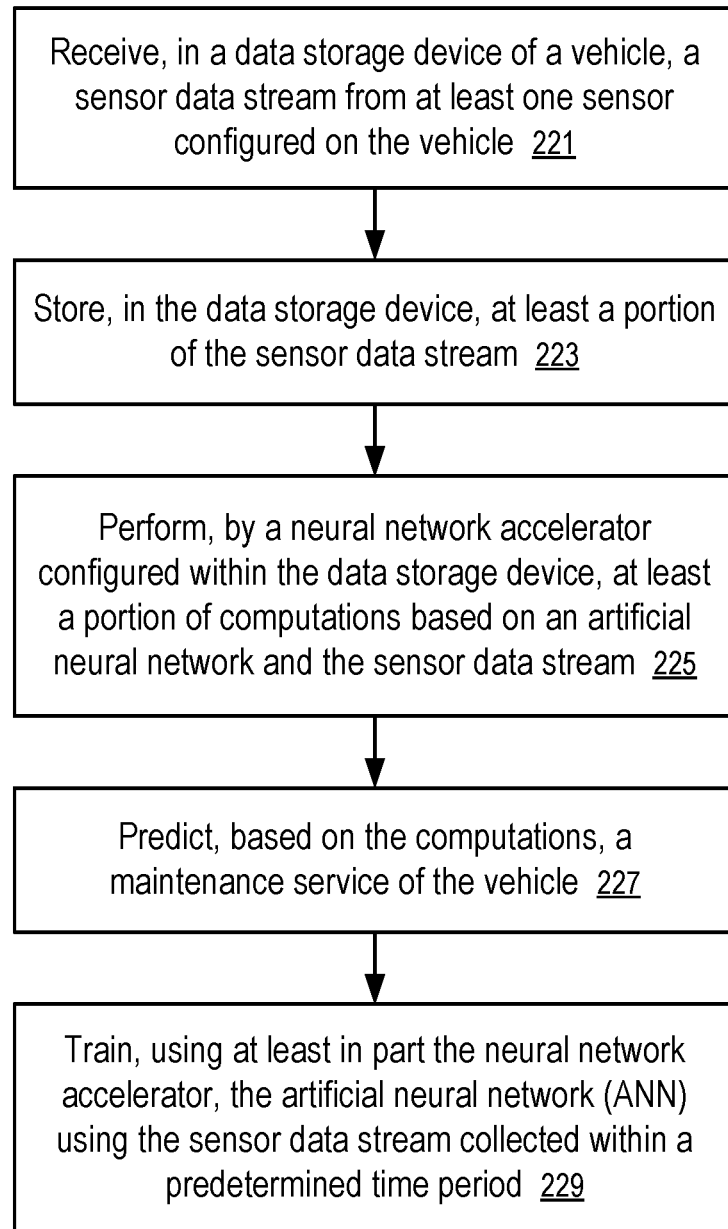
FIG. 9 shows a method to accelerate neural network computations in motor vehicles according to one embodiment.

FIG. 9 shows a method to accelerate neural network computations in motor vehicles according to one embodiment. For example, the method of FIG. 9 can be implemented in a vehicle (111) of FIG. 1 or 2 using a data storage device (101) of FIG. 7 and/or a storage media component (160) of FIG. 8. For example, the method of FIG. 9 can be used in combination with the method of FIG. 6.

At block 221, a data storage device (101) of a vehicle (111) receives a sensor data stream from at least one sensor (e.g., 103) configured on the vehicle (111).

At block 223, the data storage device (101) stores at least a portion of the sensor data stream.

At block 225, a neural network accelerator (159) configured within the data storage device (101) performs at least a portion of computations based on an artificial neural network (125) and the sensor data stream.

At block 227, a maintenance service of the vehicle (111) is predicted based at least in part on the computations performed by the neural network accelerator (159) configured within the data storage device (101).

Optionally, at block 229, the artificial neural network (ANN) is trained in the vehicle (111), using at least in part the neural network accelerator and using the sensor data stream collected within a predetermined time period, such as a period following the delivery of the new vehicle (111) from a factory or following the replacement of a component in a maintenance service facility (127).

For example, the neural network accelerator (159) can be configured on an integrated circuit device that is separate from a controller (151) of the data storage device and/or separate from the storage media components (161 to 163).

For example, the neural network accelerator (159) can be configured on an integrated circuit device that includes a controller (151) of the data storage device (101), or on an integrated circuit device that includes storage media component (160, 1061 or 163) of the data storage device (101).

For example, the neural network accelerator (159) can be configured to perform computations, such as matrix arithmetic computations for ANN and/or or differential equation simulations for SNN, using data stored in the data storage device (101).

Examples of the matrix arithmetic computations include matrix multiplication and accumulation operations. After a computation to generate a result of the matrix arithmetic computations using a data stored in the data storage device (101), the neural network accelerator (159) can provide the result as output of the data storage device (111) in retrieving data (e.g., in response to a read command). Alternatively, or in combination, the result of the matrix arithmetic computation can be buffered in the data storage device (101) as operand for a next matrix computation performed in combination with a matrix of data retrieved from the non-volatile memory via a read command received in the host interface (157).

When the artificial neural network (ANN) (125) includes a spiking neural network (SNN), the neural network accelerator can be configured to simulate a differential equation controlling activation levels of neurons in the spiking neural network (SNN). Optionally, the storage media component is configured to store states of the neurons in the spiking neural network according to a predetermined pattern; and the neural network accelerator is configured to automatically update the states of the neurons over time according to the differential equation. For example, the neural network accelerator (159) can be configured to train the spiking neural network (SNN) via unsupervised machine learning to detect anomaly.

The computations performed by the neural network accelerator (159) according to an artificial neural network (ANN) (125) involve different types of data that have different patterns of usages of the data storage device (101).

For example, making a prediction using the artificial neural network (ANN) (125) includes the use of data specifying the model of the artificial neural network (ANN) (125), input data provided to the artificial neurons, and output data generated by the artificial neurons.

The storage capacity of the data storage device (101) can be partitioned into different portions for the different types of ANN-related data. The different portions can be separately configured to optimize the access and storage of the corresponding data according to their patterns of usages by the neural network accelerator (159) and/or the processor(s) (133) of the computer system (131) in which the data storage device (101) is configured.

The model of the artificial neural network (ANN) (125) can include the parameters specifying the static attributes of individual artificial neurons in the ANN (125) and the neuron connectivity in the ANN (125). The model data of the ANN (125) is static and does not change during the prediction calculation made using the ANN (125). Thus, the usage pattern of the model data is mostly read. However, the model data of the ANN (125) can change when an updated ANN (125) is installed. For example, the vehicle (111) can download an updated ANN (125) from the server (119) to the data storage device (101) of the vehicle (111) to update its prediction capability. The model data of the ANN (125) can also change during or after the training of the ANN (125) using a machine learning technique (e.g., 171 or 175). It is preferred to configure a separate partition or namespace of the data storage device (101) to store the model data, where the partition or namespace is operated according to configuration parameters that optimize the memory units for the specific usage patterns of the model data (e.g., mostly read, infrequent update). For example, when the memory units are implemented using a flash memory based on NAND logic gates, the memory units in the ANN model partition/namespace can be configured to operate in a multi-level cell (MLC) mode, a triple level cell (TLC) mode, or a quad-level cell (QLC) mode, wherein each memory cells stores two, three, or four bits for increased storage capability.

Input data provided to the artificial neurons in the ANN (125) can include external inputs and internal inputs. The external inputs are generated typically by the sensors (103) of the vehicle (111) but not by artificial neurons in the ANN (125). The external inputs can be saved in a cyclic fashion so that the input data of the most recent time period of a predetermined length of driving can be found in the data storage device (101). Thus, it is preferred to configure a separate partition or namespace of the data storage device (101) to store the external input data, where the partition or namespace is operated according to configuration parameters that optimize the memory units for the storage pattern of the external input data (e.g., enhanced endurance, cyclic overwrite). For example, when the memory units are implemented using a flash memory based on NAND logic gates, the memory units in the ANN input partition/namespace can be configured to operate in a single level cell (SLC) mode, where each memory cell stores one bit of data for improved endurance in cyclic overwriting operations.

In some implementations, artificial neurons can have state variables that change over time in response to inputs during prediction calculations. For example, the activation level of a spiking neuron can change over time and is considered a dynamic state variable of the spiking neuron. In some implementations, such state variable data of artificial neurons has a similar storage usage pattern as the external input data; and thus, the state variable data can be stored in the partition or namespace configured for the external input data. In other implementations, the state variable data of artificial neurons is kept in a buffer and stored less frequently than the external inputs; and thus, another partition/namespace can be configured for storing the dynamic state variable data of artificial neurons.

Output data generated by the artificial neurons in the ANN (125) can be buffered for further access by the neural network accelerator (159) and/or the processor(s) (133) of the computer system (131). The output data can include external outputs and internal outputs. The external inputs are generated by artificial neurons as the output from the ANN (125), such as the results of classifications or predictions made by the ANN (125). The output of the ANN (125) is typically further processed by the processor(s) (133) of the computer system (131). The external inputs may be saved periodically (e.g., in a way similar to the storing of the state variable data). The internal outputs and/or some of the external outputs can be internal inputs to artificial neurons in the ANN (125). In general, it may not be necessary to store the internal outputs from the buffer of the data storage device to the storage media components. In some implementations, when the buffer capability of the data storage device (101) is insufficient to hold the entire state variable data and/or the internal outputs, the data storage device (101) can use a swap partition/namespace to extend the capacity of the buffer. The swap partition/namespace can be configured for optimized random access and for improved endurance.

External outputs and/or dynamic states of neurons can be saved in a separate output partition or namespace, in a cyclic way so that the external output data and/or dynamic states of the neurons can be periodically stored, and the most recent sets of the external outputs and/or dynamic states can be found in the data storage device (101). External outputs and/or dynamic states of neurons can be stored selectively, since some of such data can be re-generated by the ANN from the external inputs stored in the input partition or namespace. Preferably, the output partition or namespace is configured to store one or more sets of external outputs and/or dynamic states that cannot be created from the external inputs stored in the input partition or namespace. In storing data in a cyclic way in an input/output partition or namespace, the oldest stored data sets are erased to make rooms for the most recent data sets. The ANN input/output partition/namespace can be configured for an optimized sequential write stream for copying data from the buffer of the data storage device into the memory units in the storage media components of the data storage device.

Figure 10:
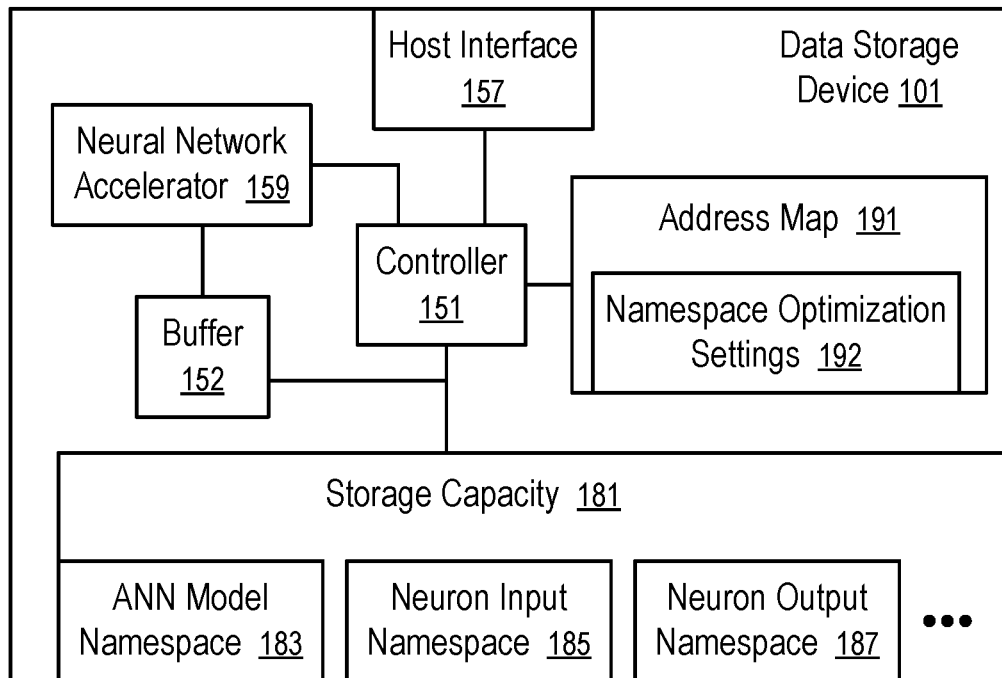
FIG. 10 shows a data storage device configured to support neural network computations according to one embodiment.

FIG. 10 shows a data storage device (101) configured to support neural network computations according to one embodiment. For example, the data storage device (101) can be used in the vehicle (111) in FIG. 1 or 2 to facilitate predictive maintenance and/or support the ADAS (105).

The data storage device (101) of FIG. 10 includes a host interface (157) and a controller (151), similar to the data storage device (101) of FIG. 7.

The storage capacity (181) of the data storage device (101) of FIG. 10 can be implemented using a set of storage media components, similar to the storage media components (161 to 163) in the data storage device (101) of FIG. 7.

A set of namespaces (183, 185, 187, . . . ) can be created on the storage capacity (181) of the data storage device (101). Each of the namespace (e.g., 183, 185, or 187) corresponds to a named portion of the storage capacity (181). Logical addresses are defined within each namespace. An address map (191) is configured to map between the logical addresses defined in the namespaces (183, 185, 187, . . . ) to the physical addresses of memory units in the storage media components (e.g., 161 to 163 illustrated in FIG. 7).

The address map (191) can include namespace optimization settings (192) for the namespaces (183, 185, and 187).

For example, an ANN model namespace (183) can be a memory/storage partition configured for the model data of the artificial neural network (ANN) (125). The namespace optimization settings (192) optimizes the memory operations in the ANN model namespace (183) according to the data usage pattern of ANN models (e.g., mostly read, infrequent update centric).

For example, a neuron input namespace (185) can be a memory/storage partition configured for the external input data to the artificial neural network (ANN) (125). The namespace optimization settings (192) optimizes the memory operations in the neuron input namespace (185) according to the data usage pattern of the external input data (e.g., for enhanced endurance supporting cyclic overwrite of continuous input data flow for sequential writes).

For example, a neuron output namespace (187) can be a memory/storage partition/configured for the external output data provided from the artificial neural network (ANN) (125). The namespace optimization settings (192) optimizes the memory operations in the neuron output namespace (187) according to the data usage pattern of the external output data (e.g., improved endurance for periodically overwrite of data with random read/write access).

The data storage device (101) includes a buffer (152) configured to store temporary/intermediate data of the artificial neural network (ANN) (125), such as the internal inputs/outputs of the artificial neurons in the ANN (125).

Optionally, a swap namespace can be configured in the storage capacity (181) to extend the capacity of the buffer (152).

Optionally, the address map (191) includes a mapping between logic memory addresses received in the host interface (157) to access data of artificial neurons and the identities of the artificial neurons. Thus, a read or write command to access one type of data of an artificial neuron in one namespace can cause the controller 151 to access another type of data of the artificial neuron in another namespace.

For example, in response to a request to write external input data for a neuron into the storage capacity (181) of the data storage device (185), the address map (191) can be used to calculate the addresses of the model parameters of the neuron in the ANN model namespace (183) and read the model parameters into the buffer (152) to allow the neural network accelerator (159) to perform the computation of the output of the neuron. The output of the neuron can be saved in the buffer (152) as the internal input to other neurons (e.g., to reduce write amplification). Further, the identities of the other neurons connected to the neuron can also be retrieved from the ANN model namespace (183) into the buffer (152), which allows the neural network accelerator (159) and/or the processor to further process the propagation of the output in the ANN (125). The retrieval of the model data from the ANN model namespace (183) can be performed in parallel with the storing of the external input data into the neuron input namespace (185). Thus, the processors (133) of the computer system (131) of the vehicle (111) do not have to explicitly send in read commands for the retrieval of the model data from the ANN model namespace (183).

Similarly, in response to reading output data of a neuron, the address map (191) can be used to compute the addresses of the model parameters of the neuron stored in the ANN model namespace (183) and read the model parameters into the buffer (152) to allow the neural network accelerator (159) to apply internal inputs in the buffer (152) to the perform the computation of the output of the neuron. The computed output can be provided as a response to the reading of the output data for the neuron, without the data storage device (101) having to store the output data in the storage media components (e.g., 161 to 163). Thus, the processors (133) and/or the neural network accelerator (159) can control the computations of the neuron via writing inputs to neurons and/or reading outputs from neurons.

In general, incoming external input data to the ANN (125) can be raw sensor data (121) generated directly by the sensors (103) without processing by the processors (133) and/or the neural network accelerator (159). Alternatively, indirect sensor data (121) that has processed by the processors (133) for the ANN (125) from the signals from the sensors (103) can be provided as the external input data. The incoming external input data can be accepted in the host interface (157) and written in a cyclic way into the neuron input namespace (185), and automatically buffered in the buffer (152) for neural network accelerator (159) to generate neuron outputs using the model stored in the ANN model namespace (183). The outputs generated by the neural network accelerator (159) can be further buffered as internal inputs for further application of the model in the ANN model namespace (183). When the external outputs become available, the data storage device (101) can report the completion of the write requests with an indication of the availability of the external outputs. Optionally, the controller 151 and/or the neural network accelerator (159) can generate internal read commands to propagate signals in the ANN (125) in generating the external outputs. Alternatively, the host processors (133) can control the propagation of signals in the ANN (125) by selectively reading outputs of neurons; and the data storage device (101) can actively buffer data that may be needed in the buffer (152) to accelerate the ANN computation.

Figure 11:
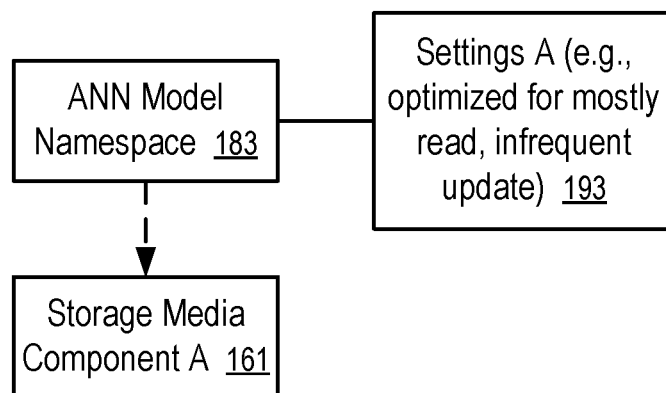
FIG. 11 illustrates the configuration of a namespace for an artificial neural network (ANN) model according to one embodiment.

FIG. 11 illustrates the configuration of a namespace (183) for an artificial neural network (ANN) model according to one embodiment. For example, the configuration of FIG. 11 can be implemented in the data storage device (101) illustrated in FIGS. 7 and/or 10. For example, the settings (193) of FIG. 11 can be part of the namespace optimization settings (192) of FIG. 10.

The configuration of FIG. 11 maps an ANN model namespace (183) to at least one storage media component A (161). Preferably, the at least one storage media component A (161) can be used by the controller (151) in parallel with storage media components (e.g., 163) that hosts the other namespaces (e.g., 185 and 187) of ANN data. For example, the storage media component A (161) can be in an integrated circuit package that is separate from the integrated circuit packages for the other namespaces (e.g., 185 and 187). Alternatively, the storage media components (161 to 163) are formed on separate integrated circuit dies embedded in a same integrated circuit package. Alternatively, the storage media components (161 to 163) can be formed on separate regions of an integrated circuit die, where the separate regions can be operated substantially in parallel (e.g., for read, for erase, and/or for write).

In FIG. 11, the settings (197) are optimized to the usage pattern of mostly read and infrequent update.

Figure 12:
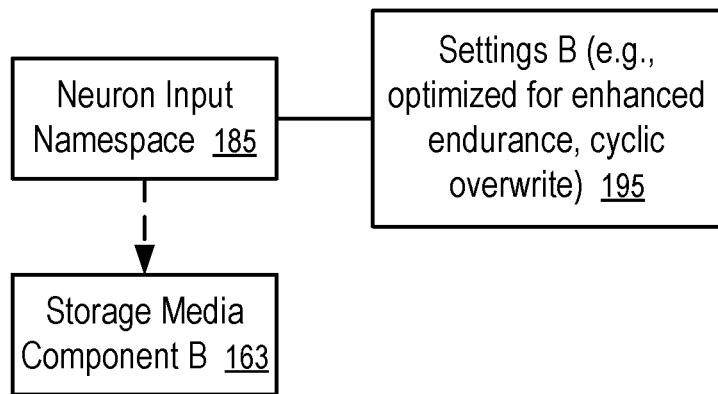
FIG. 12 illustrates the configuration of a namespace for the inputs to artificial neurons according to one embodiment.

FIG. 12 illustrates the configuration of a namespace (185) for the inputs to artificial neurons according to one embodiment. For example, the configuration of FIG. 11 can be implemented in the data storage device (101) illustrated in FIGS. 7 and/or 10. For example, the settings (195) of FIG. 11 can be part of the namespace optimization settings (192) of FIG. 10.

The configuration of FIG. 12 maps a neuron input namespace (185) to at least one storage media component B (163). Preferably, the at least one storage media component B (163) can be used by the controller (151) in parallel with storage media components (e.g., 161) that hosts the other namespaces (e.g., 183 and 187) of ANN data. For example, the storage media component B (163) can be in an integrated circuit package that is separate from the integrated circuit packages for the other namespaces (e.g., 183 and 187). Alternatively, the storage media components (161 to 163) are formed on separate integrated circuit dies embedded in a same integrated circuit package. Alternatively, the storage media components (161 to 163) can be formed on separate regions of an integrated circuit die, where the separate regions can be operated substantially in parallel (e.g., for read, for erase, and/or for write).

In FIG. 12, the settings (197) are optimized to the usage pattern of enhanced endurance in cyclic sequential overwrite in recording a continuous stream of input data that is sampled at a fixed time interval.

Figure 13:
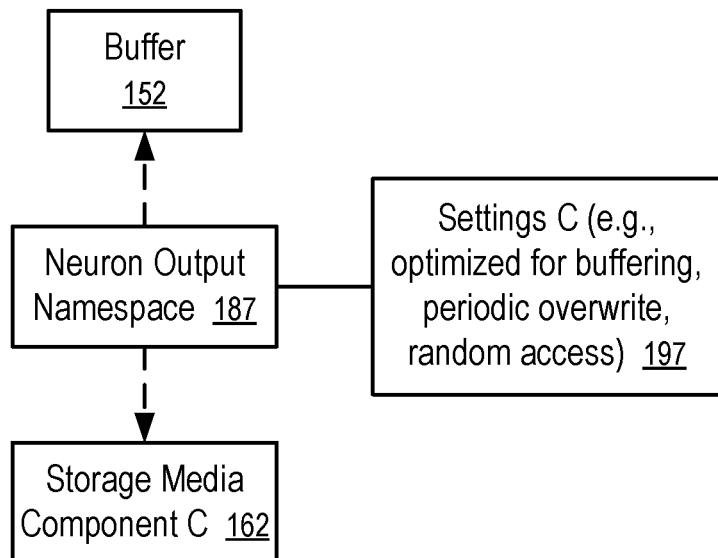
FIG. 13 illustrates the configuration of a namespace for the outputs from artificial neurons according to one embodiment.

FIG. 13 illustrates the configuration of a namespace (187) for the outputs from artificial neurons according to one embodiment. For example, the configuration of FIG. 11 can be implemented in the data storage device (101) illustrated in FIGS. 7 and/or 10. For example, the settings (197) of FIG. 11 can be part of the namespace optimization settings (192) of FIG. 10.

The configuration of FIG. 13 maps a neuron output namespace (187) to at least one storage media component C (162). Preferably, the at least one storage media component C (162) can be used by the controller (151) in parallel with storage media components (e.g., 161 and 163) that hosts the other namespaces (e.g., 183 and 185) of ANN data. For example, the storage media component C (162) can be in an integrated circuit package that is separate from the integrated circuit packages for the other namespaces (e.g., 183 and 185). Alternatively, the storage media components (161 to 163) are formed on separate integrated circuit dies embedded in a same integrated circuit package. Alternatively, the storage media components (161 to 163) can be formed on separate regions of an integrated circuit die, where the separate regions can be operated substantially in parallel (e.g., for read, for erase, and/or for write).

Figure 14:
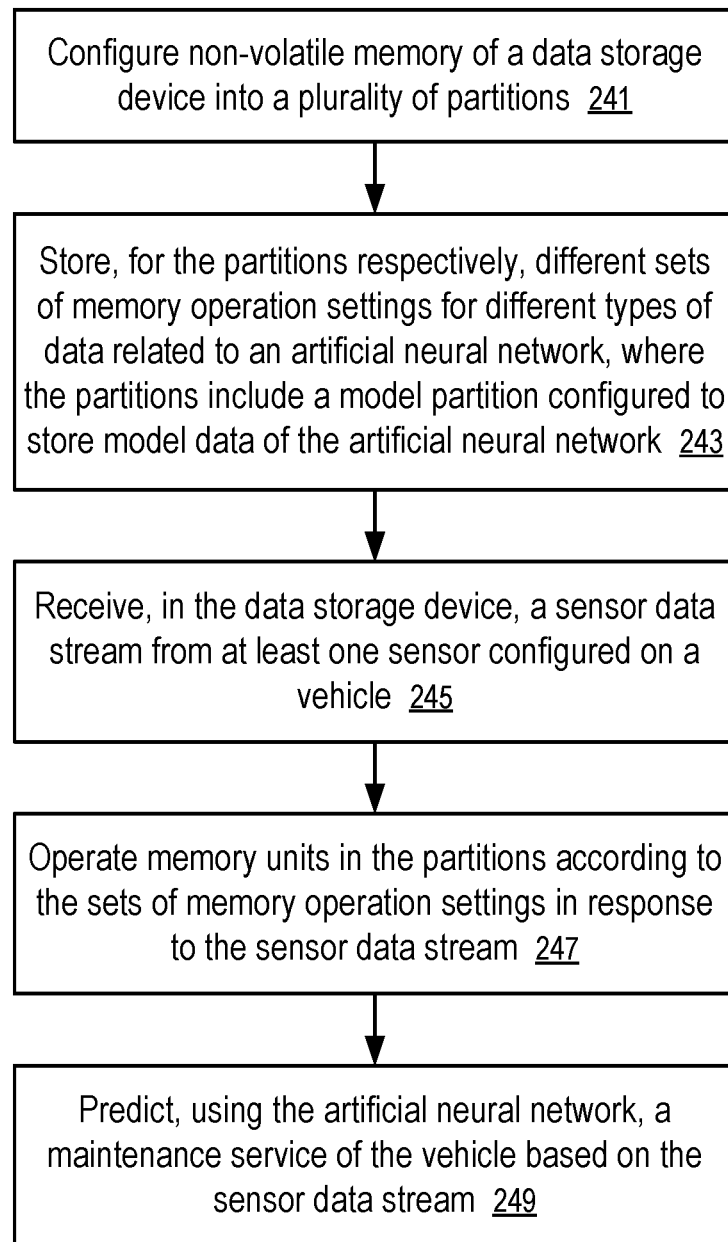
FIGS. 14-16 show methods of predictive maintenance supported by a model partition, an input partition and an output partition according to one embodiment.

In FIG. 13, the settings (197) are optimized to the usage pattern of buffered data for periodic overwrite with random access. For example, memory units are configured via the optimization settings (193 to 197) to update/overwrite in the neuron output namespace (187) at a frequency higher than in the ANN model namespace (183), but lower than in the neuron input namespace (185). For example, the FIG. 14 shows a method of predictive maintenance supported by a model partition according to one embodiment. For example, the method of FIG. 14 can be implemented in a vehicle (111) of FIG. 1 or 2 using a data storage device (101) of FIG. 7 or 10 and/or a storage media component (160) of FIG. 8. For example, the method of FIG. 14 can be used in combination with the method of FIGS. 6 and/or 9.

At block 241, non-volatile memory of a data storage device (101) is configured into a plurality of partitions (e.g., 183, 185, 187, . . . ). For example, the non-volatile memory can have the same type of memory units for storing data (e.g., NAND flash memory units); and the same type of memory units in the different partitions (e.g., 183 to 187) can be configured differently to optimize their performances according to the usage patterns of the data stored in the different partitions (e.g., 183 to 187).

At block 243, the data storage device (101) stores, for the partitions (e.g., 183, 185, 187, . . . ) respectively, different sets of memory operation settings (e.g., 193, 195, 197) for different types of data related to an artificial neural network (125), where the partitions (e.g., 183, 185, 187, . . . ) include a model partition (e.g., 193) configured to store model data of the artificial neural network (125).

At block 245, the data storage device (101) receives a sensor data stream (e.g., 121) from at least one sensor (103) configured on a vehicle (111).

At block 247, a controller (151) of the data storage device (101) operates memory units in the partitions (183, 185, 187, . . . ) according to the sets of memory operation settings (e.g., 193, 195, 197) in response to the sensor data stream (e.g., 121).

At block 249, the computer system (131) having the data storage device (101) predicts, using the artificial neural network (125), a maintenance service of the vehicle (111) based on the sensor data stream (e.g., 121).

For example, the memory operation settings configure the model partition (e.g., 183) to store three or more bits per memory cell. The memory operating settings can include address map (191) to map between neurons in the ANN (125) and inputs to the neurons. When a first address of an input to a neuron in the artificial neural network (125) is received, the first address in an input partition (e.g., 185) separate from the model partition (e.g., 183) can be converted into at least one second address of model data associated with the neuron, such that the attributes of the neuron and the identities of neurons connected to the neuron can be retrieved from the model partition (e.g., 183) without an explicit command from the processors (133). The controller (151) can automatically retrieve, from the model partition (e.g., 183), the model data associated with the neuron using the at least one second address, in response to the receiving of the first address. A neural network accelerator (159) can generate an output of the neuron from the input to the neuron and the model data associated with the neuron. In general, input to the neuron can include outputs from multiple neurons that are connected to the neuron in the ANN (125). The controller (151) can save the output of the neuron in the buffer (152) in the data storage device (101) to facilitate accelerated access to the output by the host processor(s) (133) and/or the neural network accelerator (159).

Typically, the model data does not change during computation to predict the maintenance service. For example, the model data can include neuron connectivity data of the artificial neural network and static attributes of neurons in the artificial neural network. The memory operation settings (e.g., 192) can configure the model partition (e.g., 183) to store more than one bit per memory cell in the non-volatile memory based on the usage pattern of mostly read, infrequent update of the model data.

For example, the partitions (e.g., 183, 185, 187, . . . ) in the data storage devices can be implemented as namespaces in which logical addresses are defined; and an address map (191) in the data storage device is configured to map the namespaces (183, 185, 187, ... ) to separate storage media components (e.g., 161, 163, 162, ... ).

The model data in the model namespace (183) is updatable during training via machine learning (171 or 175), or during over-the-air update of the ANN (125) from the server (119).

In some implementations, the controller (151) is configured, via the address map (191) to retrieve, from the model partition, model data associated with a neuron in the artificial neural network, in response to an input to, or an output from, the neuron being addressed in a partition separate from the model partition (183). Further, the controller (151) can retrieve, from the model partition (183), the model data associated with the neuron in parallel with storing input to the neuron in the partition (e.g., 185) that is separate from the model partition (183).

Figure 15:
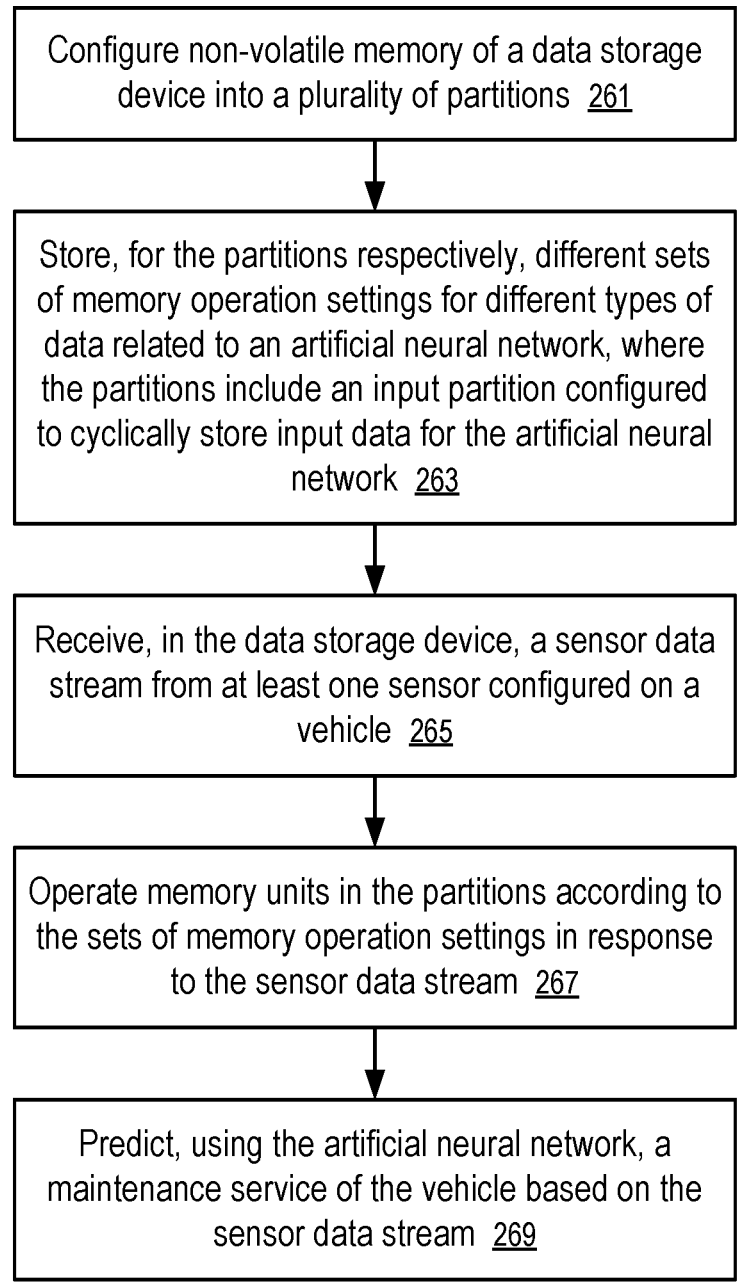

FIG. 15 shows a method of predictive maintenance supported by an input partition according to one embodiment. For example, the method of FIG. 15 can be implemented in a vehicle (111) of FIG. 1 or 2 using a data storage device (101) of FIG. 7 or 10 and/or a storage media component (160) of FIG. 8. For example, the method of FIG. 15 can be used in combination with the method of FIGS. 6, 9, and/or 14.

At block 261, non-volatile memory of a data storage device (101) is configured into a plurality of partitions (e.g., 183, 185, 187, ... ). For example, the non-volatile memory can have the same type of memory units (e.g., NAND flash memory units) implemented in multiple storage media components (e.g., 161 to 163).

At block 263, the data storage device (101) stores, for the partitions (e.g., 183, 185, 187, ... ) respectively, different sets of memory operation settings (e.g., 193, 195, 197) for different types of data related to an artificial neural network (125), where the partitions (e.g., 183, 185, 187, ... ) include an input partition (e.g., 185) configured to cyclically store input data for the artificial neural network (125).

For example, the input partition (185) can be configured to store external inputs for the artificial neural network (125) but not internal inputs. The input data stored in the input partition (185) is independent of outputs from neurons in the artificial neural network (125).

For example, the input data stored in the input partition (185) can include a portion of the sensor data stream (e.g., 121). In some embodiments, the input data stored in the input partition (185) is computed from the sensor data stream (e.g., 121) for a subset of neurons in the artificial neural network (125).

For example, the memory operation settings (e.g., 195) configure the input partition (185) to store one bit per NAND memory cell in the non-volatile memory for enhanced endurance for repeated data erasure and data programming.

For example, the memory operation settings (e.g., 195) configure the controller to write sequentially the input data into to the input partition (185), and to overwrite oldest input data in the input partition (185) with the most recent input data received in the data storage device (101).

At block 265, the data storage device (101) receives a sensor data stream (e.g., 121) from at least one sensor (103) configured on a vehicle (111).

At block 267, a controller (151) of the data storage device (101) operates memory units in the partitions (183, 185, 187, ... ) according to the sets of memory operation settings (e.g., 193, 195, 197) in response to the sensor data stream (e.g., 121).

At block 269, the computer system (131) having the data storage device (101) predicts, using the artificial neural network (125), a maintenance service of the vehicle (111) based on the sensor data stream (e.g., 121).

Figure 16:
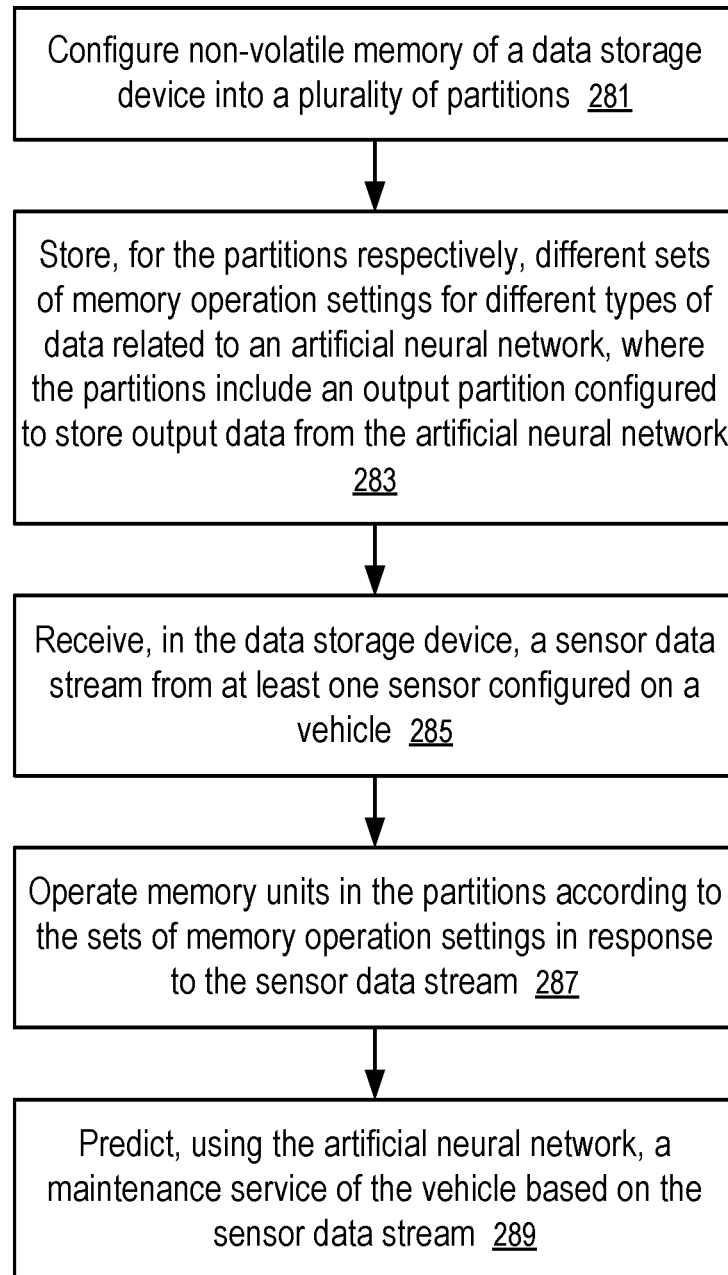

FIG. 16 shows a method of predictive maintenance supported by an input partition according to one embodiment. For example, the method of FIG. 16 can be implemented in a vehicle (111) of FIG. 1 or 2 using a data storage device (101) of FIG. 7 or 10 and/or a storage media component (160) of FIG. 8. For example, the method of FIG. 16 can be used in combination with the method of FIGS. 6, 9, 14, and/or 15.

At block 281, non-volatile memory of a data storage device (101) is configured into a plurality of partitions (e.g., 183, 185, 187, ... ). The non-volatile memory can have the same type of memory units (e.g., NAND flash memory units) for storing data.

At block 283, the data storage device (101) stores, for the partitions (e.g., 183, 185, 187, ... ) respectively, different sets of memory operation settings (e.g., 193, 195, 197) for different types of data related to an artificial neural network (125), where the partitions (e.g., 183, 185, 187, ... ) include an output partition (e.g., 187) configured to store output data for the artificial neural network (125).

For example, the output data stored in the output partition (e.g., 187) can include state data of neurons in the artificial neural network (125). For example, the state data of the neurons in the artificial neural network can identify the activation levels of the neurons for spiking in a spiking neural network. The activation levels can be controlled via a differential equation. Thus, the activation levels can change in response to inputs to the artificial neural network (125) and/or in response to the passage of time.

For example, the output data can include the predictions or classifications generated by the artificial neural network (125) responsive to the sensor data stream.

For example, the memory operation settings configure the output partition to store no more than two bits per memory cell in the non-volatile memory.

At block 285, the data storage device (101) receives a sensor data stream (e.g., 121) from at least one sensor (103) configured on a vehicle (111).

At block 287, a controller (151) of the data storage device (101) operates memory units in the partitions (183, 185, 187, ... ) according to the sets of memory operation settings (e.g., 193, 195, 197) in response to the sensor data stream (e.g., 121).

At block 289, the computer system (131) having the data storage device (101) predicts, using the artificial neural network (125), a maintenance service of the vehicle (111) based on the sensor data stream (e.g., 121).

For example, the data storage device (101) can include a buffer (152). The buffer (152) can be implemented via volatile memory (e.g., SRAM or DRAM) for access performance faster than the non-volatile memory (e.g., NAND flash memory) of the data storage device (101). The memory operation settings configure the controller (151) to store the output data in the buffer (152) for access by a processor (e.g., 133) via the host interface (157) during or after storing the output data into the output partition (187).

For example, the data storage device (101) can include a neural network accelerator (159) coupled to the controller (151). The neural network accelerator is configured to apply inputs provided to neurons in the artificial neural network (125) to model data of the artificial neural network (125) to generate the output data by one or more output neurons in the artificial neural network (125). In response to the neural network accelerator (159) completing the computation of the output data, the controller is configured to provide the processor (e.g., 133) with an indication of the availability of the output data generated by the artificial neural network (125), such that the processor (e.g., 133) may request the data storage device (101) to transmit the output data.

Optionally, the controller (151) is configured to provide the output data to the processor in parallel with storing the output data into the output partition. For example, the controller (151) can be configured to automatically discard the output data computed for the previously segment of sensor data stream if the processor (e.g., 133) does not request for the transmission of the output data to the processor (e.g., 133) within a predetermined period of time, or before the next version of the output data is available. Optionally, after reporting the availability of the output data to the processor (e.g., 133), the controller (151) can be configured to selectively discard the output data computed for the previously segment of sensor data stream based on a response of the processor (e.g., 133) for the output data to the processor (e.g., 133). For example, the processor (e.g., 133) may request the transmission of the output data to the processor (e.g., 133) without saving the output data into the output partition (e.g., 187) in some situations; and in other situations, the processor (e.g., 133) may request the transmission of the output data to the processor (e.g., 133) and the storing of the output data into the output partition (e.g., 187).

Optionally, output data from the artificial neural network (125) can also be stored into the output partition in a cyclic way (e.g., for the segments of output data for time periods selected by the processor (e.g., 133)).

For example, external inputs to the artificial neural network (125) can be recorded in the input namespace (185) continuously for the last time period of T1. When the sensor data is sampled at a predetermined time interval T2, the input namespace (185) can hold the latest T1/T2 sets of input data. In contrast, external outputs from the artificial neural network (125) can be selectively recorded into the output namespace (187) (e.g., once for every a predetermined period of time T3, where T3 is multiple of T2). The output data can be recorded into the output namespace (187) at a lower frequency; and the output namespace (187) can be allocated to store a predetermined number of sets of output data (e.g., via sequential writes and writes in a cyclic way to keep the last sets of output data).

At least some embodiments disclosed herein include a communication protocol/interface that allows a data storage device to perform neural network acceleration on the fly with reduced data traffic to the host processor (e.g., a central processing unit (CPU)).

For example, the host processor (e.g., 133) of a vehicle (111) can provide write commands to the data storage device (101) to store the model of an artificial neural network in a model partition (e.g., 183). Since the neural network accelerator (159) is configured to apply the model, the data communications sending back the data of the model of ANN (125) to the processor can be reduced or eliminated.

To use the ANN model in classifications and/or predictions, the host processor (e.g., 133) of a vehicle (111) can stream input data for the ANN (125) into the neuron input partition (e.g., 185). The neural network accelerator (159) of the storage device (101) can automatically apply the input data to the model stored in ANN model partition (e.g., 183) in accordance with the address map (191). The data storage device (101) makes the computed outputs available for propagation in the ANN (125). Preferably, the computed outputs are made available to the neural network accelerator (159) through the buffer (152) without the need to store the intermediate outputs into storage media components (e.g., 161 to 163). Thus, the data communications between the host processor (e.g., 133) and the data storage device (101) for the transporting of outputs of neurons can be reduced. When the outputs have propagated to the output neurons in the ANN (125), the data storage device (101) can provide a response to the write request associating with the writing of a set of input data into the neuron input partition (e.g., 185). The response indicates that the external output from neurons in the ANN (125) is available. In response, the host processor (e.g., 133) of a vehicle (111) can optionally issue read commands to retrieve the external outputs for further processing.

Figure 17:
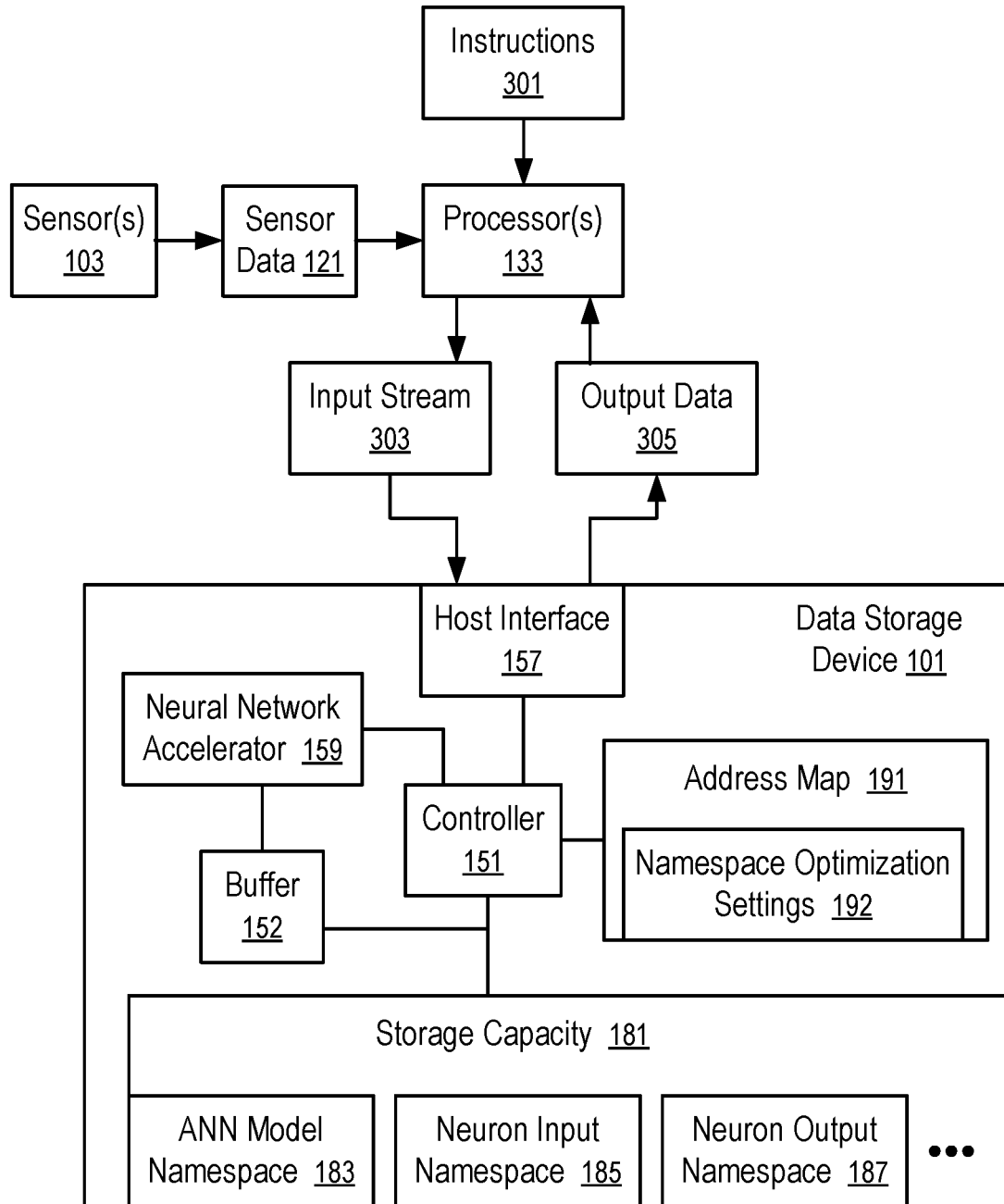
FIG. 17 shows communications with a data storage device to implement neural network computation according to one embodiment.

FIG. 17 shows communications with a data storage device (101) to implement neural network computation according to one embodiment. For example, the communications as illustrated in FIG. 17 can be implemented in the vehicle (111) of FIG. 1 or 2, with a data storage device (101) illustrated in FIG. 7 or 10.

In FIG. 17, the processor(s) (133) can be configured with a simplified set of instructions (301) to perform neural network computation, since some of the computations involving the ANN (125) is performed by the neural network accelerator (159) within the data storage device (101). Thus, it is not necessary to transport the model data back to the processor(s) (133) during the use of the ANN (125) for predictions and/or classifications.

The sensor(s) (103) can generate a continuous stream of sensor data (121) based on a rate for sampling data. The sensor data (121) can be sampled at a fixed, predetermined time interval (e.g., during the operation of the vehicle (111)). The processor(s) (133) can execute the instructions (301) to convert the sensor data (121) into an input stream (303) for input neurons in the ANN (125). Input neurons in the ANN (125) are configured to accept external inputs to the ANN (125); and output neurons are configured to provide external outputs from the ANN (125).

In general, a complete set of input for the ANN (125) at a time instance includes inputs for the entire set of input neurons of the ANN (125). The input stream (303) includes a sequence of input sets for a sequence of time instances that are spaced apart from each other according to the fixed, predetermined time interval.

The data storage device (101) stores the input stream (303) into the neuron input namespace (185) in a cyclic way where the oldest input set corresponding to the oldest time instance of data sampling for data sets currently stored in the neuron input namespace (185) is erased to store the newest set of inputs in the input stream (303).

For each input data set, the neural network accelerator (159) applies the model of the ANN (125) stored in the ANN model namespace (183). The neural network accelerator (159) (or the processor(s) (133)) can control the propagation of signals within the neural network. When the output neurons of the ANN (125) generate their outputs responsive to the input data set, the data storage device (101) can provide to the processor (133) an indication that the neuron output are ready for retrieval. The indication can be configured in a response to the request from the processor(s) (133) to write the input data set into the neuron input namespace (185). The processor(s) (133) can optionally retrieve the output data (305) (e.g., in accordance with conditions and/or criteria programmed in the instructions).

In some embodiments, a trigger parameter is configured in the data storage device (101). When an output parameter in the external output (317) meetings a requirement specified by the trigger parameter, the data storage device provides the response to the request from the processor(s) (133) to write the input data set into the neuron input namespace (185).

Figure 18:
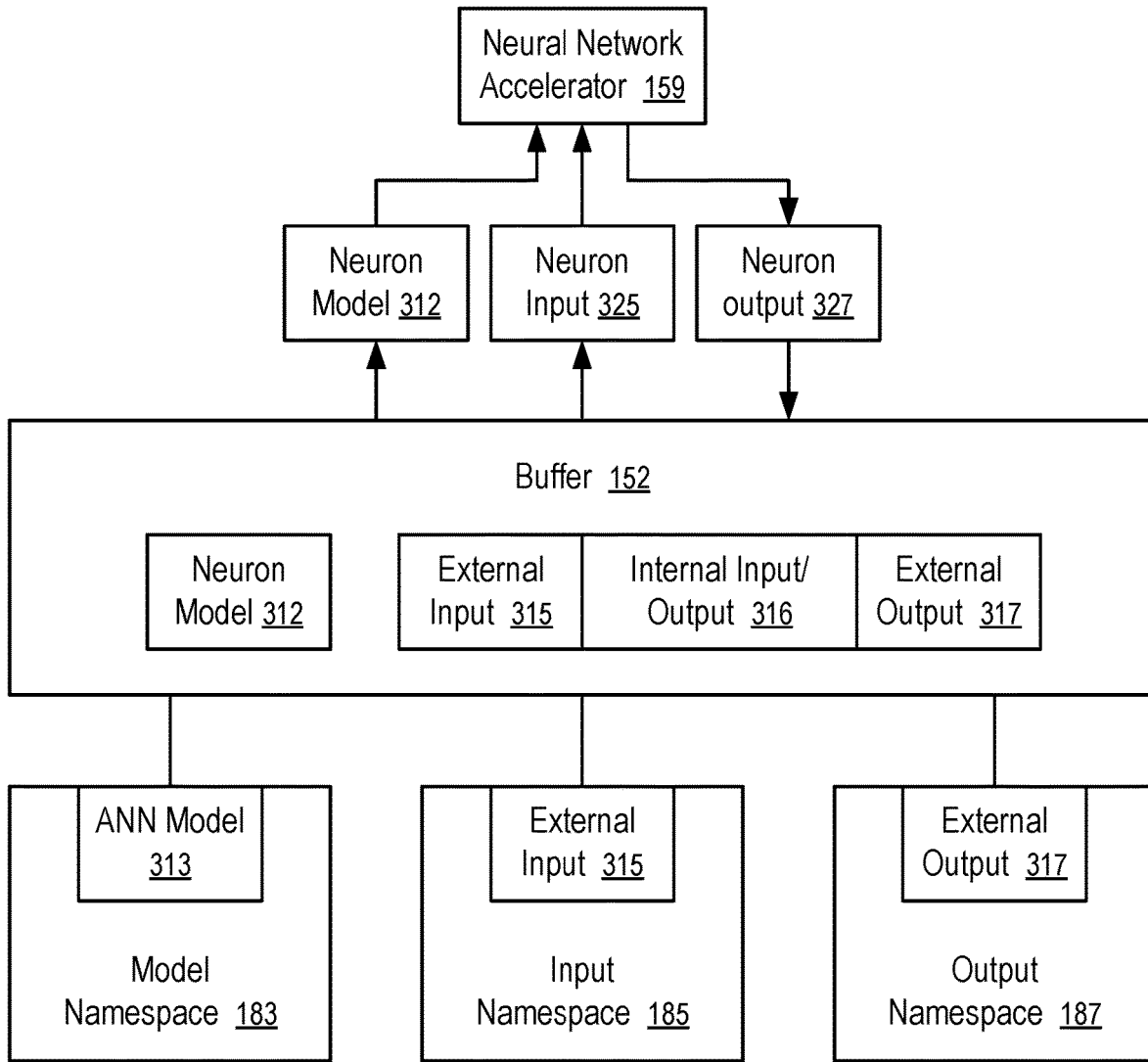
FIG. 18 shows communications within a data storage device to implement neural network computation according to one embodiment.

FIG. 18 shows communications within a data storage device to implement neural network computation according to one embodiment. For example, the communications of FIG. 18 can be implemented a data storage device (101) illustrated in FIG. 7 or 10, in connection with the communications of FIG. 17.

In FIG. 18, the model namespace (183) stores the model (313) of the entire ANN (125). In response to receiving a set of external input (315) for a time instance from the input stream (303) in the buffer (152), the data storage device (101) can write the external input (315) into the input namespace (185) in parallel with retrieving a neuron model (312) containing a portion of the ANN model (313) corresponding to the parameters of the input neurons and/or the identities of neurons connected to the input neurons. The buffer (152) allows the neural network accelerator (159) to combine the neuron model (312) and the external input (325) to generate the output (327) of the input neurons.

In general, the neuron output (327) can include a portion that is the internal output (316) for further propagation within the ANN (125) and/or a portion that is the external output (317) for the processor(s) (133).

The internal output (316) is stored in the buffer (152) as internal input (316) for further propagation in the ANN (125) in a way similar to the generation of neuron outputs (327) from the external input (315). For example, a portion of the internal input (316) can cause the controller (151) and/or the neural network accelerator (159) to retrieve corresponding neuron model (312) relevant to the internal input such that the internal input is applied in the neural network accelerator (159) to the corresponding neuron model (312) to generate their neuron outputs (327).

When the complete set of external output (317) is available in the buffer (152), the external output (317) can be stored in the output namespace (187).

Optionally, the storage device (101) does not store each set of external output (317) corresponding to a set of stored external input (315) sampled at a time instance. For example, the storage device (101) can be configured to store one set of external output (317) for every a predetermined number of sets of external input (e.g., 315). Alternatively, or in combination, the processor(s) (133) can determine whether or not to store the external output (317). For example, the storage device (101) can be configured to store the external output (317) in response to the processor(s) (133) retrieving the external output (317) for further processing. For example, the storage device (101) can be configured to store the external output (317) in response to a write command from the processor(s) (133) after the processing of the external output (317) in the processor(s) (133).

Figure 19:
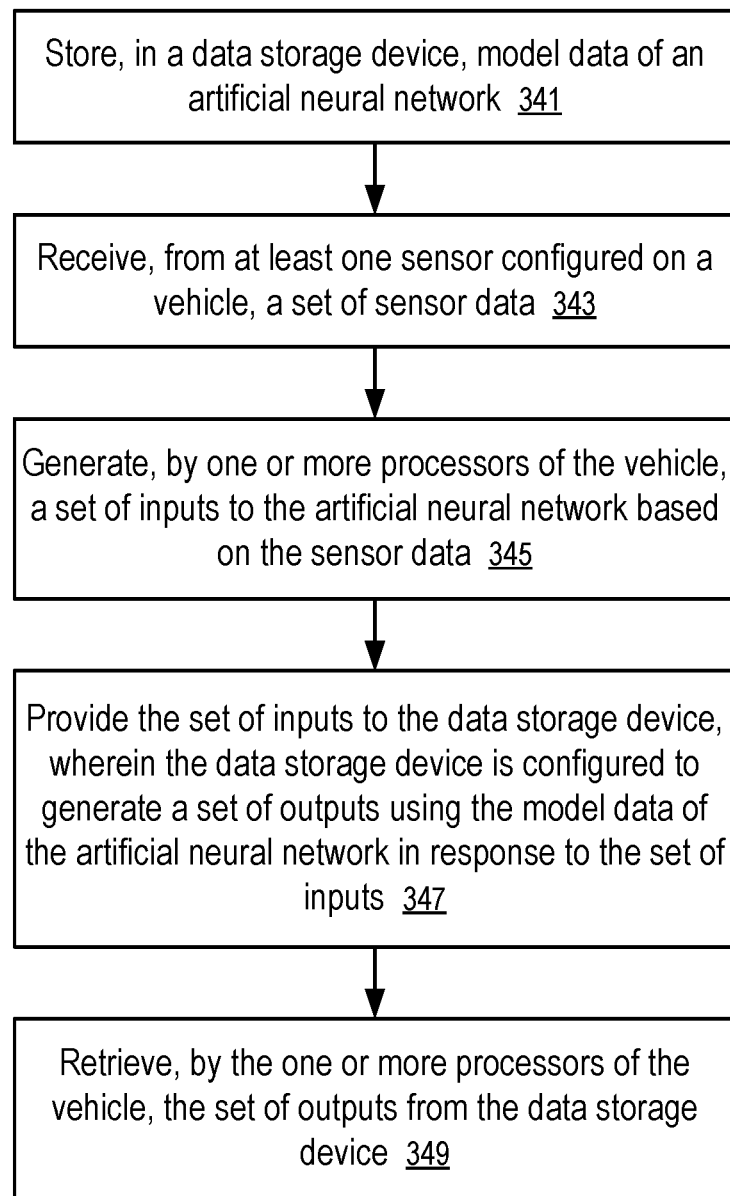
FIG. 19 shows a method of communicating with a data storage device to implement neural network computation according to one embodiment.

FIG. 19 shows a method of communicating with a data storage device to implement neural network computation according to one embodiment. For example, the method of FIG. 19 can be implemented in a vehicle (111) of FIG. 1 or 2 using a data storage device (101) of FIG. 7 or 10 and/or a storage media component (160) of FIG. 8. For example, the method of FIG. 19 can be used in combination with the method of FIGS. 6, 9, 14, 15, and/or 16.

At block 341, one or more processors (133) of a vehicle (111) stores model data (e.g., 313) of an artificial neural network (e.g., 125) into a data storage device (101).

At block 343, the one or more processors (133) of the vehicle (111) receive, from at least one sensor (103) configured on vehicle (111), a set of sensor data.

At block 345, the one or more processors (133) of the vehicle (111) generate a set of inputs to the artificial neural network (e.g., 125) based on the sensor data.

At block 347, the one or more processors (133) of the vehicle (111) provide the set of inputs to the data storage device (101). In response to the set of inputs, the data storage device (101) is configured to generate a set of outputs using the model data (313) of the artificial neural network (e.g., 125).

At block 349, the one or more processors (133) of the vehicle (111) retrieve the set of outputs from the data storage device (101).

For example, the data storage device (101) generates the set of outputs using at least a portion of the model data (183) stored in the data storage device without transmitting the portion of the model data (183) to the one or more processors (133) between the receiving of the set of inputs and the completion of the computation of the set of outputs.

For example, the portion of the model data (183) can include static attributes of neurons in the artificial neural network (e.g., 125) and/or the neuron connectivity data of the artificial neural network (e.g., 125).

For example, to provide of the set of inputs to the data storage device (101), the one or more processors (133) of the vehicle (111) can transmit one or more write commands to the data storage device (101). The one or more write commands are configured to instruct the data storage device (101) to store the set of input in the data storage device (101). After the completion of the computation of the set of outputs in the data storage device (101), the controller (151) of the data storage device (101) can transmit a response to the one or more write commands to the one or more processors (133). The response can include an indication that the set of outputs is available for retrieval by the one or more processors (133).

In response to the indication, the one or more processors (133) can optionally retrieves of the set of outputs from the data storage device (101) by transmitting a read command to the data storage device (101) for the set of outputs (e.g., after a determination to retrieve the set of outputs from the data storage device (101) for processing).

Alternatively, or in combination, the one or more processors (133) of the vehicle (111) can determine whether to store the set of outputs in non-volatile memory of the data storage device. In response to a determination to store the set of outputs in the non-volatile memory of the data storage device (101), one or more processors (133) of the vehicle (111) can transmit a write command to the data storage device (101).

Since the set of outputs is initially generated in the data storage device (101) and then buffered in the buffer (152) (e.g., volatile memory), the data storage device (101) can execute a write command to store the set of outputs into an output namespace (187) without transmitting the set of outputs to the one or more processors (133) and/or receiving the set of outputs from the one or more processors (133) in response to the write commands.

For example, after receiving, from at least one sensor (103) configured on the vehicle (111), a further set of sensor data (121), the one or more processors (133) of the vehicle (111) generate a further set of inputs to the artificial neural network (125) based on the further set of sensor data.

The one or more processors (133) transmits a further command to write the further set of inputs into the data storage device (101); and the data storage device (101) generates a further set of outputs using the model data (183) of the artificial neural network (125) and the further set of inputs. After receiving a response to the further command to write the further set of inputs, the one or more processors (133) can determine to skip the processing of the further set of outputs and transmit, to the data storage device (101), a subsequent write command to store the further set of outputs. In response, the data storage device (101) can write the further set of outputs that is buffered within the data storage device (101) into the output namespace (187), without the transmitting of the further set of outputs from the one or more processors (133) of the vehicle (111) to the data storage device (101) and/or without the transmitting of the further set of outputs from the data storage device (101) to the one or more processors (133) of the vehicle (111).

At least some of the neural network techniques discussed above can be used in the optimization of the operations of a data storage device based on temperature according to one embodiment.

When a data storage device (e.g., a solid state drive (SSD)) is installed on a vehicle, the vehicle can expose the data storage device to a wide range of operating temperatures. One or more temperature sensors can be used to measure the operating temperature of the data storage device; and an artificial neural network (ANN) (e.g., spiking neural network, convolutional neural network, recurrent neural network) can be used to predict the optimized setting(s) for a data storage operation (e.g., read or write) at a temperature.

For example, a temperature sensor can be configured in the vehicle, in the data storage device, and/or in a memory chip of the data storage device. The temperature measurements from the sensor(s) are indicative of the operating temperature for a data storage operation, such as storing or writing data into a media unit, or retrieving or reading data from a media unit.

An artificial neural network (ANN) (e.g., spiking neural network, convolutional neural network, recurrent neural network) can be configured to predict the optimized settings for the data storage operation. Such settings can be temperature dependent for optimal performance and/or reduced errors. Example of such settings can include the voltage thresholds used for reading data from a media unit, memory refresh frequency, voltages for programming/storing data, etc.

Optionally, the ANN can be configured to be at least partially self-trained within the storage device. For example, the data storage device can generate and/or store performance data indicating temperatures, the settings used in performing input/output operations (e.g., read or write) in the data storage device at the respective temperatures, and indications of the performance levels of the results of input/output operations performed using the settings. Examples of the performance level indications can include the bit error rate of retrieved data, read disturb, optimized voltage threshold determined from automatic read calibration, etc.

The performance data can be used to train the ANN to predict optimized settings for different temperatures. For example, an unsupervised learning technique can be applied to the ANN to self-organize the performance data into clusters for classification/prediction. For example, a supervised learning technique can be applied to the ANN to refine or establish a prediction model of one or more settings at an operating temperature.

For example, the operating parameters of the storage device and the temperatures of the operations can be provided as input to the ANN. Parameters indicative of the qualities of the results of the operations (e.g., bit error rate of retrieved data, read disturb, optimized voltage threshold determined from automatic read calibration) can also be used as input for classification/self-organizing using an unsupervised learning technique, or as labels for predictions using a supervised learning technique.

Figure 20:
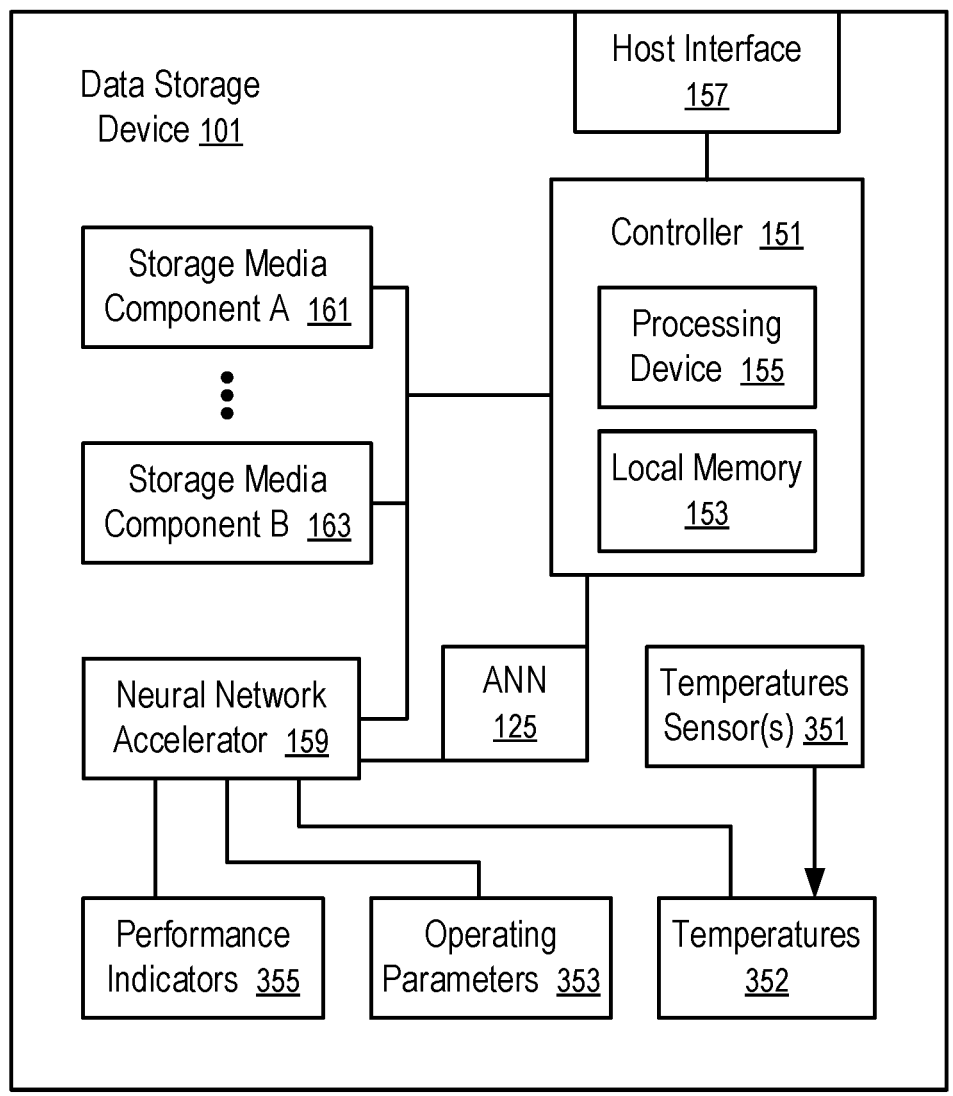
FIG. 20 shows a data storage device configured to optimize its operations based on temperature according to one embodiment.

FIG. 20 shows a data storage device configured to optimize its operations based on temperature according to one embodiment. For example, the data storage device of FIG. 20 can be implemented using the techniques of a data storage device (101) of FIG. 7 or 10 in a vehicle (111) illustrated in FIG. 1 or 2.

In FIG. 20, one or more temperature sensors (351) are configured in the data storage device (101). Each of the temperature sensor(s) (351) is configured to measure its current temperature and thus the temperature at a location where the temperature sensor (351) is configured.

For example, the data storage device (101) can have an enclosure in which a temperature sensor (351) is located to measure the average temperature of the data storage device (101). The controller (151) and/or the neural network accelerator (159) can obtain the measurements from the temperature sensor (351) periodically.

In some implementations, each of the storage media components (161 to 163) is an integrated circuit (IC) chip that provides a set of memory units. A temperature sensor (351) can be configured in each of the storage media components (161 to 163) to more precisely measure the temperature of the memory units in the corresponding IC chip. For example, each of the IC chip can have a register configured to store the temperature measurement of the temperature sensor (351) configured within the IC chip; and the controller (151) and/or the neural network accelerator (159) can obtain the measurements from the temperature registers of the media components (161 to 163) periodically.

In some implementations, an integrated circuit (IC) chip (e.g., 161) can have multiple integrate circuit dies enclosed within a same integrated circuit package. Each of the integrated circuit dies can have a temperature sensor (351) measure its temperature. Optionally, different sections of an integrated circuit die can have temperature sensors (351) configured to measure the temperatures of the corresponding sections of the integrated circuit die. The temperature measurements of the temperature sensors (351) within a IC die or chip can be stored in respective registers within the IC die or chip; and the controller (151) and/or the neural network accelerator (159) can obtain the measurements from the temperature registers periodically.

Alternatively, the sensors (103) of the vehicle (111) include a temperature sensor configured to measure the environmental temperature of the data storage device (101). The environmental temperature of the data storage device (101) is provided to the data storage device (101) as part of the stream of sensor data (121) configured for the prediction of a maintenance service of the vehicle (111) and/or a prediction or classification for the ADAS (105) of the vehicle (111).

When the controller (151) performs input/output operations on the storage media components (161 to 163), the operating parameters (353) used in the input/output operations are associated with the temperatures (352) of the memory units involved in the input/output operations.

For example, during an operation to read data from a memory unit (or a block of memory units, or an IC die of memory units, or an IC chip of memory units), the operating parameters (353) can be the voltage threshold configured to read data from a memory unit, or one or more parameters used to calculate the voltage threshold. After retrieving the data from the memory unit, error correcting code (ECC) operations can be performed to detect and/or correct errors in the retrieved data. An error rate can be calculated for the retrieved data as the performance indicator(s) (355) of the performance level of the operating parameters (353) for reading at the temperature (352) for the respective memory units.

For example, during an operation to write/program data into a memory unit (or a block of memory units, or an IC die of memory units, or an IC chip of memory units), the operating parameters (353) can be the voltage configured to write/program data into a memory unit, or one or more parameters used to calculate the voltage. After write/program operation, the data stored in the memory unit can be retrieved for comparison with the original data to determine an error rate. When the errors in the retrieve data can be corrected via error correcting code (ECC) operations, the write/program operation can be considered successful. The error rate can be used as the performance indicator(s) (355) of the performance level of the operating parameters (353) for writing at the temperature (352) in the respective memory units.

The performance data associates the temperatures (352), operating parameters (353) of input/output operations performed at the temperatures (352), and the performance indicators (355) of the input/output operations. The performance data can be used by the neural network accelerator (159) and/or the controller (151) to train an artificial neural network (125) configured in the data storage device (101).

For example, the artificial neural network (125) configured as the ANN model (313) stored in a model namespace (183) allocated from the storage media components (161 to 163) via the address map (191) illustrated in FIG. 17.

The performances levels represented by the performance indicators (355) for the operating parameters (353) can evolve over time for a same temperature (352) based on the usage history of the storage media components (161 to 163). The ANN (125) can be initially trained based on a similar set of media components that are tested and trained in a manufacturing or research facility. Subsequently, the performance data collected in the data storage device (101) can further train and customize the ANN (125) for the data storage device (101).

The ANN (125) can be used to improve the operations of the data storage device (101). For example, prior to the performance of an input/output operation at a temperature, the controller (151) and/or the neural network accelerator (159) can use the ANN (125) to determine or predict the optimized operating parameters (353) and the corresponding performance indicators (355). After using the operating parameters (353) predicted by the ANN (125) in the input/output operations, the performance indicators (355) measured for the results can be compared with the performance indicators (355) predicted by the ANN (125) to detect deviations that can be used to further train the ANN (125).

For example, when the deviation is within a threshold level, the newly generated performance data, including the temperature (352), the operating parameters (353) predicted by the ANN (125), and the performance indicators (355) measured for the operation performed using the operating parameters (353) predicted by the ANN (125), can be used to incrementally train the ANN (355) (e.g., using a reinforcement learning technique) to improve the accuracy of the predictions of the ANN (125).

When the deviation is above a threshold level for a temperature (352), the controller (151) is configured to generate further training data for the ANN (125). For example, instead of using the operating parameters (353) predicted by the ANN (125), the controller (151) introduces a limited random variation to the operating parameters (353) predicted by the ANN (125) to generate the operating parameters (353) used in the input/output operations at the temperature (352). The performance indicators (353) measured for the operating parameters (353) used in the input/output operations can be used to train the ANN (125) to locally modify the ANN (125) for improved prediction for optimized operating parameters (353).

Figure 21:
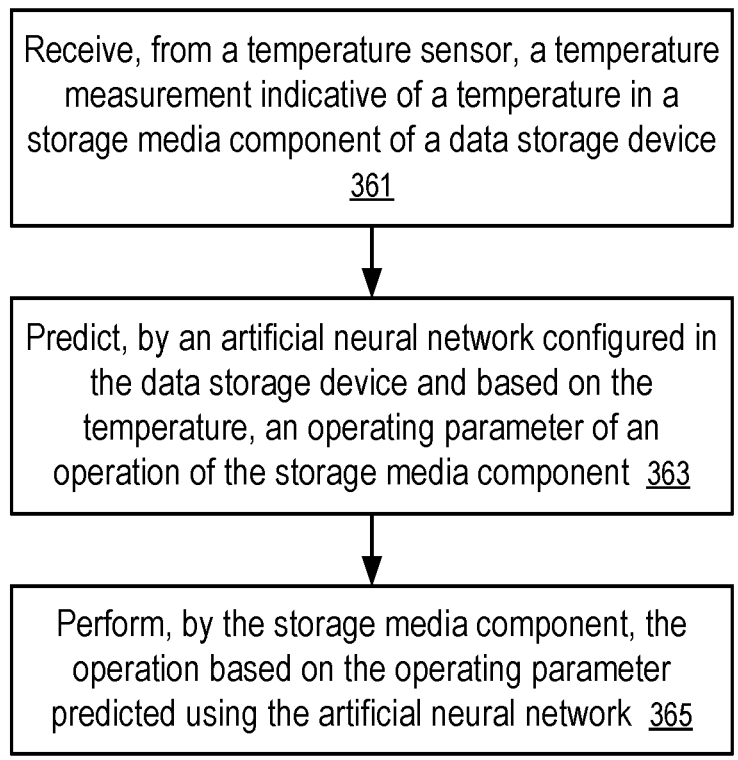
FIG. 21 shows a method of optimization of the operations of a data storage device according to one embodiment.

FIG. 21 shows a method of optimization of the operations of a data storage device according to one embodiment. For example, the method of FIG. 21 can be implemented in a vehicle (111) of FIG. 1 or 2 using a data storage device (101) of FIG. 7, 10, 20 and/or a storage media component (160) of FIG. 8. For example, the method of FIG. 21 can be used in combination with the method of FIGS. 6, 9, 14, 15, 16, and/or 19.

At block 361, a data storage device (101) receives, from a temperature sensor (in 351 or 103), a temperature measurement indicative of a temperature (352) in a storage media component (e.g., 161 or 163) of the data storage device (101).

For example, the data storage device (101) can be installed in a vehicle (111) that has a sensor (e.g., 103) configured to measure the environmental temperature (352) of the data storage device (101).

For example, the data storage device (101) can include a built-in temperature sensor (351) that measures its operating temperature (352). The temperature sensor (351) can be configured to measure the operating temperature (352) of the data storage device (101) as a whole, or the operating temperature specific to the storage media component (e.g., 161 or 163) or a particular portion of memory cells in the storage media component (e.g., 161 or 163). For example, different temperature sensors (351) can be configured in different portions of the storage media component (e.g., 161 or 163) to measure the operating temperatures of different portions of memory cells in the storage media component (e.g., 161 or 163).

For example, the storage media component (e.g., 161 or 163) can be an integrated circuit chip having multiple memory units; and the temperature sensor (351) can be formed in the integrated circuit chip among the multiple memory units.

At block 363, an artificial neural network (125) configured in the data storage device (101) predicts, based on the temperature (352), an operating parameter (e.g., 353) of an operation of the storage media component (e.g., 161 or 163). Optionally, the prediction can be further based on temperature history and/or memory usage history for a set of memory units involving the operation.

For example, the artificial neural network (125) can include a spiking neural network.

For example, the operation can include programming/writing data into one or more memory cells in the storage media component (e.g., 161 or 163), or reading/retrieving data from one or more memory cells in the storage media component (e.g., 161 or 163), or any combination thereof.

For example, the operating parameter can include a voltage to be applied on a memory cell during the operation. For example, the voltage can be a threshold voltage for reading a bit from a memory cell that stores more than one bit of data (e.g., in an MLC, TLC or QLC mode). For example, the voltage can be a voltage for programming a memory cell to store more than one bit of data (e.g., in an MLC, TLC or QLC mode).

For example, the voltages applied to read a memory cell can disturb the state of nearby memory cells. The read disturb effect can cause errors in retrieving data from the nearby memory cells. Thus, after a number of read cycles, the data storage device can retrieve the data from the memory cells and rewrite it. The frequency of rewriting data to mitigate read disturb can be optimized for temperature and/or temperature history. The artificial neural network (125) can be used to predict an optimized refresh frequency based on the temperature and/or usage history.

Optionally, the artificial neural network (125) configured in the data storage device (101) further predicts, based on the temperature (352), a performance level (e.g., 355) of a result of the operation of the storage media component (e.g., 161 or 163) performed using the operating parameter predicted by the artificial neural network (125).

For example, the performance level (e.g., 355) can identify error rate in the result of the operation performed by the storage media component (e.g., 161 or 163).

For example, the data storage device (101) can have a neural network accelerator (159) configured to predict, at the temperature (352), the operating parameter (353) and/or the performance level (e.g., 355), using model data (313) of the artificial neural network (125) stored in a model namespace (183) in the data storage device (101).

At block 365, the storage media component (e.g., 161 or 163) performs the operation based on the operating parameter (e.g., 353) predicted using the artificial neural network (125).

Optionally, the data storage device (101) is configured to measure the performance level (e.g., 355) of the result of the operation of the storage media component (e.g., 161 or 163) performed using the operating parameter predicted by the artificial neural network (125).

For example, the data storage device (101) can compare the measured the performance level with the predicted performance level to determine whether to further train the artificial neural network (125).

For example, when the difference between the measured the performance level and the predicted performance level is above a threshold, the data storage device (101) can generate training data for the artificial neural network (125). The training data can be generated by performing an operation using variations of operating parameters predicted for a temperature (352) and measuring the preference indicators (355) of the results of the operation performed using the different operation parameters. For example, randomized variations can be applied to the operating parameter predicted by the artificial neural network (125) to generate randomized operating parameters for the generating of the training data.

In some implementations, the artificial neural network (125) can predict the performance level of a result generated by using one or more operating parameters at a temperature (352); and the data storage device (101) and/or the artificial neural network (125) can be further configured to search for a set of operating parameters that optimizes the performance level at the temperature (352).

The server (119), the computer system (131), and/or the data storage device (101) can each be implemented as one or more data processing systems.

The present disclosure includes methods and apparatuses which perform the methods described above, including data processing systems which perform these methods, and computer readable media containing instructions which when executed on data processing systems cause the systems to perform these methods.

A typical data processing system may include includes an inter-connect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices may include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory may include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A data storage device, comprising:
   one or more storage media components;
   at least one temperature sensor configured to generate temperature measurements;
   a controller comprising a processing device configured to:
      receive the temperature measurements from the at least one temperature sensor;
      predict, by utilizing an artificial neural network, an operating parameter of an operation of the one or more storage media components at a temperature associated with the temperature measurements determined by the temperature sensor, wherein the operating parameter is predicted based on the temperature measurements being indicative of an operating temperature for the operation and based on a temperature history and a memory usage history of the data storage device;
      perform the operation based on the operating parameter predicted by utilizing the artificial neural network;
      determine a difference between a measured performance level of a result of the operation performed using the operating parameter and a predicted performance level of the result of the operation to determine whether to further train the artificial neural network, wherein the predicted performance level of the result of the operation is predicted by the artificial neural network based on the temperature associated with the temperature measurements;
      apply at least one random variation to the operating parameter predicted by the artificial neural network to generate at least one randomized operating parameter; and
      generate, based on the difference between the measured performance level and the predicted performance level exceeding a threshold for the temperature and based on utilizing the at least one randomized operating parameter, training data to further train the artificial neural network for enhancing at least one future prediction associated with the one or more storage media components.

2. The data storage device of claim 1, wherein the artificial neural network is trained based on unsupervised machine learning or supervised machine learning to recognize patterns in the temperature measurements.

3. The data storage device of claim 2, wherein the operation of the data storage device includes writing data into a memory unit in a storage media component of the data storage device.

4. The data storage device of claim 3, wherein the operating parameters include a voltage to write the data into the memory unit.

5. The data storage device of claim 2, wherein the operation of the data storage device includes reading data from a memory unit in a storage media component of the data storage device.

6. The data storage device of claim 5, wherein the operating parameters include a threshold voltage to read the data from the memory unit.

7. The data storage device of claim 2, further comprising: a neural network accelerator configured to predict, at the temperature, the operating parameter using model data of the artificial neural network stored in the data storage device.

8. The data storage device of claim 7, wherein the neural network accelerator is further configured to predict, at the temperature, a predicted performance level of the result of the operation of the data storage device when the operation of the data storage device is performed using the operating parameter.

9. The data storage device of claim 8, wherein the neural network accelerator configured to train the artificial neural network using performance data generated in the data storage device; and wherein the performance data include:
temperatures measured by the temperature sensor;
operating parameters used in operations of the data storage device performed at the temperatures measured by the temperature sensor; and
performance levels of results of the operations performed at the temperatures using the operating parameters.

10. The data storage device of claim 9, wherein the performance levels identify an error rate in the result of the operations.

11. The data storage device of claim 10, wherein one or more storage media components include an integrated circuit chip having multiple memory units; and the temperature is formed in the integrated circuit chip.

12. A method, comprising:
receiving, from a temperature sensor and at a processing device of a controller of a data storage device, a temperature measurement associated with the data storage device;
predicting, by the processing device utilizing an artificial neural network configured in the data storage device and based on the temperature, an operating parameter of an operation of the storage media component, wherein the operating parameter is predicted based on the temperature measurement being indicative of a temperature for the operation and based on a temperature history and a memory usage history of the data storage device;
performing, by a storage media component of the data storage device, the operation based on the operating parameter predicted using the artificial neural network;
determine a difference between a measured performance level of a result of the operation performed using the operating parameter and a predicted performance level of the result of the operation to determine whether to further train the artificial neural network, wherein the predicted performance level of the result of the operation is predicted by the artificial neural network based on the temperature associated with the temperature measurement;
apply at least one random variation to the operating parameter predicted by the artificial neural network to generate at least one randomized operating parameter; and
generate, based on the difference between the measured performance level and the predicted performance level exceeding a threshold for the temperature and based on utilizing the at least one randomized operating parameter, training data to further train the artificial neural network for enhancing at least one future prediction associated with the storage media component.

13. The method of claim 12, further comprising:
measuring, by the data storage device, a measured performance level of the result of the operation performed by the storage media component based on the operating parameter predicted using the artificial neural network.

14. The method of claim 13, wherein the method further comprises:
training, in the data storage device, the artificial neural network using:
the temperature measurement;
an operating parameter used in performance of the operation by the storage media component; and
the measured performance level measured by the data storage device.

15. The method of claim 14, further comprising:
predicting, by the artificial neural network configured in the data storage device and based on the temperature, the predicted performance level of the result of the operation performed using the operating parameter predicted using the artificial neural network.

16. The method of claim 14,
wherein the storage media component performs the operation using the at least one randomized operating parameter, based on the operating parameter predicted using the artificial neural network.

17. A vehicle, comprising:
a data storage device; and
sensors configured to generate sensor data, including a temperature sensor configured to measure an environmental temperature of the data storage device;
wherein the data storage device includes a storage media component and an artificial neural network configured to predict an operating parameter of an operation of the storage media component at the environmental temperature, wherein the operating parameter is predicted based on the environmental temperature being indicative of an operating temperature for the operation and based on a temperature history of the data storage device, and wherein the artificial neural network is configured to predict an optimized refresh frequency for refreshing the data storage device based on the operating parameter and the temperature history and a memory usage history of the data storage device;
wherein the storage media component is configured to perform the operation based on the operating parameter predicted using the artificial neural network;
wherein the data storage device is configured to:
determine a difference between a measured performance level of a result of the operation performed using the operating parameter to a predicted performance level of the result of the operation to determine whether to further train the artificial neural network, wherein the predicted performance level of the result of the operation is predicted by the artificial neural network based on the temperature associated with the temperature measurements;
apply at least one random variation to the operating parameter predicted by the artificial neural network to generate at least one randomized operating parameter; and
generate, based on the difference between the measured performance level and the predicted performance level exceeding a threshold for the temperature and based on utilizing the at least one randomized operating parameter, training data to further train the artificial neural network for enhancing at least one future prediction associated with the one or more storage media components.

18. The vehicle of claim 17, wherein the operation includes programming data into memory cells, or reading data from memory cells, or any combination thereof.

19. The vehicle of claim 18, wherein the operating parameter includes a voltage to be applied on a memory cell during the operation.

20. The vehicle of claim 19, wherein the data storage device is further configured to train the artificial neural network using performance data including:
   temperatures measured by the temperature sensors;
   operating parameters used in operations performed by the storage media component; and
   performance levels of the operations performed using the operating parameters at the temperatures.

* * * * *